United States Patent [19]

Oizumi et al.

[11] Patent Number: 4,994,133
[45] Date of Patent: Feb. 19, 1991

[54] CONTINUOUS PROCESS FOR PRODUCING REINFORCED RESIN LAMINATES

[75] Inventors: Masayuki Oizumi; Masakazu Uekira, both of Kobe; Masana Goto, Miki; Ichiro Azumi, Ohtsu; Shoji Uozumi; Masaharu Abe, both of Kobe; Yasuo Fushiki, Takatsuki; Minoru Isshiki, Kobe; Kunio Kawasaki, Akashi, all of Japan

[73] Assignee: Kanegafuchi Kagaku Kogyo Kabushiki Kaisha, Osaka, Japan

[21] Appl. No.: 737,134

[22] Filed: May 23, 1985

Related U.S. Application Data

[62] Division of Ser. No. 555,836, Nov. 28, 1983, Pat. No. 4,571,279, which is a division of Ser. No. 384,438, Jun. 2, 1982, Pat. No. 4,451,317, which is a division of Ser. No. 223,402, Jan. 8, 1981, Pat. No. 4,372,800.

[30] Foreign Application Priority Data

Jan. 8, 1980 [JP] Japan .................................. 55-1020

[51] Int. Cl.⁵ .............................................. B32B 31/00
[52] U.S. Cl. ................................... 156/270; 156/247; 156/286; 156/307.4; 156/313; 156/314; 156/315; 156/323; 156/324; 264/102; 428/246; 428/251; 428/901

[58] Field of Search ............... 156/313, 323, 247, 324, 156/286, 330, 270, 332, 314, 382, 315, 307.3, 307.4; 427/350, 411, 407.3; 264/102; 428/246, 901, 251; 29/829; 174/68.5; 260/453 RZ

[56] References Cited

U.S. PATENT DOCUMENTS

| | | | |
|---|---|---|---|
| 2,495,640 | 1/1950 | Muskat | 156/224 |
| 2,596,162 | 5/1952 | Muskat | 156/222 |
| 2,632,744 | 3/1953 | Howard | 156/315 |
| 3,236,714 | 2/1966 | Traut | 156/323 |
| 4,451,317 | 5/1984 | Oizumi et al. | 156/315 |

Primary Examiner—John J. Gallagher
Attorney, Agent, or Firm—Millen, White & Zelano

[57] ABSTRACT

A continuous process for producing reinforced resin laminates comprising the steps of impregnating a fibrous substrate with a liquid resin which is free of volatile solvent and is capable of curing without generating liquid and gaseous byproducts, laminating a plurality of the resin-impregnated substrates into a unitary member, sandwiching the laminate between a pair of covering sheets, and curing the laminate between said pair of covering sheets without applying appreciable pressure. The improvement comprises adjusting the final resin content in said resin impregnated substrate at 10 to 90% by weight based on the total weight of said impregnated substrate.

6 Claims, 2 Drawing Sheets

CONTINUOUS PROCESS FOR PRODUCING REINFORCED RESIN LAMINATES

This is a continuation of application Ser. No. 06/555,836, filed Nov. 28, 1983, now U.S. Pat. No. 4,571,279 which in turn is a continuation of application Ser. No. 06/384,438, filed June 2, 1982, now U.S. Pat. No. 4,451,317 which in turn is a continuation-in-part of Ser. No. 06/223,402, filed Jan. 8, 1981, now U.S. Pat. No. 4,372,800.

BACKGROUND OF THE INVENTION

The present invention relates to a process for continuous production of metal foil clad and unclad laminates composed of several layers of thermosetting resin-impregnated sheet substrates.

The primary purpose of the present invention is to produce laminates for electrical insulation and printed circuit wiring uses.

Such laminates are generally required to have various characteristics including excellent electrical insulation, dielectric property, chemical resistance, surface smoothness, clad peel strength, and dimensional stability under various conditions. Further requirements comprise:

(i) to have excellent thermal stability to withstand solder temperature as high as 260° C.,
(ii) to generate neither unpleasant odors nor hazardous volatile matter when heated,
(iii) to exhibit no large degree of warping adversely affecting printing and heating processes,
(iv) to be easily subjected to punching processes,
(v) to contain no bubbles impairing thermal conductivity and appearance, and
(vi) to be as cheap as possible.

These laminates are usually provided with smooth surfaces, about 0.5 mm to 5 mm in thickness and about 1000 mm by 1000 mm in area.

According to conventional technique in the art, unclad laminates are generally produced by processes wherein a fibrous substrate is impregnated with a varnish solution of a certain resin composition, dried to form a so-called "prepreg", and cut into a predetermined length, and several cut sheets, in turn, are stacked together and subjected batchwise to heat-pressing treatment. In such processes, however, the use of a solvent is essential for making up the varnish solution, and the prepreg has to be tack-free because of the restricted conditions of processing and workability. Consequently, these lead to the introduction of additional complicated plant, and to a considerable reduction in productivity.

In conventional processes, metal foil clad laminates also are produced through steps similar to the above, with the addition of a step wherein the stack is adhesively covered with metal foil, which has been preliminarily coated with an adhesive and heated to bring out the adhesive to its B stage. Although these clad laminates are used as printed circuit wiring boards and the like, they involve, in fact, problems concerning their productive efficiency and economy, because of the complicated batch processes and the high dependence on hand labor and skill.

Recently, in view of this, several continuous production methods for clad or unclad laminates have been proposed (for example, U.S. Pat. Nos. 3,236,714, 4,012,267, and Japanese Patent Publication No. SHO.53-88872).

All of these methods, however, have the following drawbacks preventing full realization of the economical and qualitative advantages inherent in a continuous production system, and are therefore only in limited use.

(a) In the case of using a varnish solution comprising a resin, the resin composition deposited in the substrate layer after drying, is, as a rule, nearly solid or an extremely viscous semifluid, and can hardly impart mirror-like surfaces to the layer. This surface roughness unavoidably allows voids or air bubbles to exist between the layers while the layers are stacked together. In order to remove completely such voids or air bubbles, the stack has to be subjected to heat as well as to a considerable degree of compression for prolonged periods during the curing step, which consequently necessitates the provision of highly complicated equipment. In addition, the provision of a drying oven and solvent recovery equipment diminishes to a large extent the advantages over the conventional batch system.

(b) When liquid thermosetting resin compounds are used instead, the above drying process is not always necessary.

On the other hand if the liquid resin generates gaseous or liquid volatile byproducts when heated, the necessity of applying prolonged pressure during the curing step still remains.

(c) Against the above difficult problem that pressure has to be applied to the continuously moving stack throughout the curing reaction, it might appear obvious to introduce a series of separate compressing devices, such as a serial combination of many pairs of heat-pressing rolls. Nevertheless, experiments have shown such a compromise is useless in providing laminates of high quality, because large periodical variations in pressure occur along the length of the moving stack, allowing partly entrapped inner bubbles to expand. Furthermore, it has been found that the periodic pressures applied to the resin composition in a hot fluid or semifluid uncured state imparted on undue local fluid mobility to the resin composition, resulting in intolerable undulations of the laminate surfaces. As a remedy, the continuous insertion of a highly rigid plate such as an iron plate between the stack and rolls has been tested to modify the adverse effects of localization and variations of pressure, but found to be less effective and at the expense of complicated equipment.

SUMMARY OF THE INVENTION

In accordance with the invention, a continuous method for producing reinforced resin laminates is provided comprising the steps of impregnating a fibrous substrate with a liquid thermosetting resin which is free of volatile solvent and is capable of curing without generating liquid and gaseous byproducts, laminating a plurality of the resin-impregnated substrates into a unitary number, sandwiching the laminate between a pair of film-or sheet-like coverings, and curing the laminate while supporting the same between said pair of coverings without applying appreciable pressure. In accordance with the invention, the degree of impregnation of said substrate in terms of the resin content in the impregnated substrated is adjusted to be from 10 to 90% by weight, preferably from 20 to 80% by weight. The adjustment may be carried out by scraping or squeezing the impregnated substrate before or after the lamination to remove excessive amounts of resin from the substrate. Alternatively, the substrate may be replenished with the resin in any suitable stage to accomplish the mentioned resin content.

The term "liquid thermosetting resin composition" used herein refers to one that does not contain any solvent component, but only components wholly convertible into a resinous solid by a thermosetting curing reaction without generation of water, carbon dioxide or the like as byproducts. Said composition is therefore mainly composed of resins of the radical polymerization or addition polymerization type, for example, unsaturated polyester resin, vinylester resin (or epoxy-acrylate resin) diallylphthalate resin, and epoxy resin. It therefore excludes resins of the condensation polymerization type, for example phenol-formaldehyde resin and melamine-formaldehyde resin.

In addition, said composition contains other components which carry out or accelerate its curing in a way which is generally known. For example, a liquid unsaturated polyester resin may contain components such as cross-linking polymerizable monomers, curing catalysts, curing accelerators and the like. Epoxy resins or the like may for example contain curing agents.

In the present invention, a covering material in continuous film or sheet form is applied to both surfaces of said unitary member, simultaneously with or subsequent to the combination of substrates. This is a way of imparting smooth surface characteristics to the final laminate products. This may be especially effective in the course of curing thermosetting resins of the radical polymerization type with the aid of curing catalysts for avoiding the adverse effect of atmospheric oxygen on the polymerization reaction.

The above applied coverings may be stripped from the surfaces of the member after curing, and recovered by rewinding, if necessary. The recovery and reuse of coverings may be desirable for product cost reduction.

In the case of production of one or two sided metal foil-clad laminates, a metal foil is used as the above covering, which effectively accelerates the curing reaction and is left as a permanent member of the finished product.

In the present invention, prior to the impregnation with the composition the substrates may be passed through an appropriate pre-impregnating step and, if necessary, a drying step, according to the use, properties and producing conditions of the product. In particular, a step wherein a cellulosic substrate is pre-impregnated with a solution of N-methylol compound and dried to remove the solvent, prior to the impregnation with liquid unsaturated polyester resin composition, is very effective in obtaining electrical insulation boards exhibiting excellent properties even under humid conditions.

In the present invention, the substrate is impregnated with a liquid thermosetting resin composition that has been initially exposed to conditions of reduced pressure, in order that the impregnation time may be reduced, and the inclusion of bubbles in the final product may be almost completely avoided.

In the present invention, the unitary stack formed by combining a plurality of impregnated substrates is continuously cured by heat but subjected to no pressure at an early curing stage, where the stack may become hard enough to be cut mechanically with ease, and the covering may be stripped readily. Then the stripped stack is cut to a practical size, and subjected to a complete curing step. This curing procedure ensures the reduction of warping and residual strain in the final product within tolerable limits for practical use.

In the present invention, the use of the liquid thermosetting resin composition which is free of volatile solvent and is capable of curing without generating gaseous or liquid byproducts throughout the curing steps, eliminate the need for equipment for drying resin varnish and recovering solvent. The fluidity of the liquid resin therefore remains practically unchanged from the impregnating step through the substrate-combining step. This makes it possible to inhibit air bubbles from becoming entrapped in the stack to a minimal extent, and renders unnecessary any extra heating and pressing in said step.

Furthermore, the substantial absence of entrapped air bubbles and volatile byproducts in the body of the stack makes it possible to yield laminate products of excellent properties only by heating. This eliminates the need for complicated equipment for applying pressure on the laminate during the continuous curing step.

It can be said to be epoch-making that a method for continuous production of such a laminate of excellent properties by impregnating sheet substrates with liquid thermosetting resin composition, and by curing the resulting impregnated stack without pressure application, is realized by the present invention. According to the method of the present invention, many advantages may be offered regarding the product and its productivity. For example, the creation of strains caused by an extra compression applied in the curing step may be avoided from the product, and excellent thermal dimensional stability, especially in thickness, may be secured. Other advantages include the exclusion of such complicated systems as a series of separate compressing devices mentioned previously, and the reproducibility of excellent smooth surface characteristics without using any extra compressing means. Other advantages may become apparent as described later.

In the present invention, the heat-curing oven is operated under normal atmospheric pressure conditions without any artificially exerted pressure. In the strictest sense, the covering material may exert slight amounts of pressure upon the stack by virtue of its own gravity, but such slight amounts of pressure may not actually exceed 0.01 kg/cm$^2$, and are negligible because resin composition is not squeezed out under such slight pressure.

The types of heating and transferring means employed in the present invention are largely optional, and they necessitate no complex equipment for continuous compression procedure. For example, each one of the methods mentioned below may be useful for heat-curing and transferring the stack without the application of compression:

(a) The continuous length of stack is supported on a series of several rollers at intervals of, for example, 1 m, and blown by hot air on one or both sides.

(b) The floating dryer method, well-known in the art, is useful; that is, the stack is allowed to float in air and transferred continuously, being subjected on its upper and lower sides to jet streams of hot air.

(c) The stack is placed on a continuous hot plate, transferred and conductively heated.

(d) The stack is heated by radiation heat from hot plates and the like in a heat-curing oven.

The laminates produced by the method of the present invention are superior in thickness uniformity to those produced by conventional means. For laminates of 1.5 mm thickness, for example, the variation ranges at most within 20μ to 30μ, while it conventionally reaches 70μ to 160μ. In addition, the heat expansion rates in thickness are as low as 40 to 60% of those of the conventional laminates.

Furthermore, the present invention exhibits great advantages in aspects such as reduction of production cost, increase of production speed, and simplification of the manufacturing plant.

DETAILED DESCRIPTION OF THE INVENTION

Figure 1:
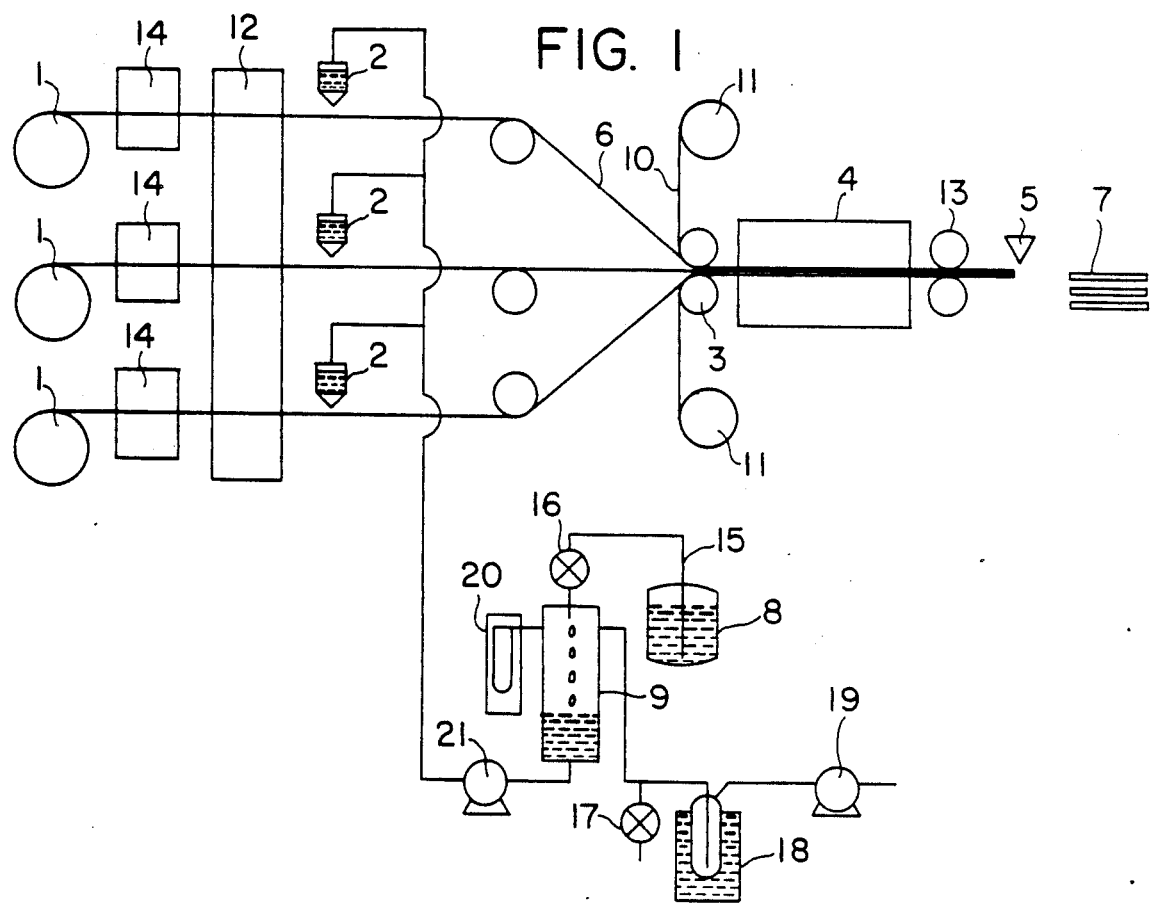
FIG. 1 represents the apparatus used in the present invention.

As illustrated in FIG. 1, the present invention essentially provides that a plurality of sheet substrates 6 are supplied from storing sections 1, continuously transferred to and sequentially treated by an apparatus to produce laminates 7, used herein comprises a continuous drying equipment 12, impregnating devices 2, a laminating device 3, a continuous heat-curing device 4, a take-off device 13 and a cutting device 5. The continuous heat-curing device 4 does not include any pressure mechanism.

In the present invention, said sheet substrate 6 implies various web materials which have been used in conventional laminate production, for example, fiber glass cloths, fiber glass nonwoven fabrics, cellulosic papers such as kraft paper and cotton-linter paper, and asbestos or other inorganic sheetings. As to papers used as the sheet substrate, paper mainly composed of cellulosic fiber, such as kraft paper, having an air-dried bulk density of 0.3 to 0.7 g/cm³, is preferable in the view point of impregnation and product quality.

Preceding the impregnation with liquid thermosetting resin composition by the impregnating device 2, the substrate is passed through a pre-impregnating process, and, if necessary, a drying process, according to properties required for final products. Pre-impregnated substrates may be provided for the storing sections 1. Alternatively, the sheet substrate 6 from the storing sections 1 may be continuously treated through pre-impregnating devices 14, and, if necessary, continuous drying equipment 12, which are arranged directly in front of the impregnating devices 2.

The continuous drying equipment is only a means to remove solvent that may possibly be contained in used pre-impregnating agent, and may therefore be eliminated if the pre-impregnation is carried out either without solvent, or by means of a gaseous compound adsorption technique.

Non-limiting pre-impregnating techniques useful in the present invention are as follows, but these may be diversely modified, as in the case in the art, depending upon the purposes of the final product.

(I) Pretreatment of substrate with various coupling agents and surface active agents. For example, pretreatment of glass cloth substrate with saline coupling agent.

(II) Pre-impregnation of substrate with various monomers capable of polymerizing or capable of copolymerizing with thermosetting resin liquids.

(III) Pre-impregnation of substrate with various thermoplastic resins with the aim of improving properties of the final laminate product.

(IV) Pre-impregnation of substrate with various thermosetting resin solutions.

(V) Pre-impregnation of substrate with various unsaturated fatty acids.

(VI) Pre-impregnation of substrate with reactive compounds and subsequent reactions, for example, acetylation of cellulosic substrate.

(VII) Pre-impregnation of substrate with certain catalysts, accelerators and/or curing agents, followed by impregnation with resin liquids of short pot life.

(VIII) Pre-impregnation of substrate with slurry of inorganic fillers.

For example, according to (I), glass cloth substrate is pretreated with vinyl alkoxysilane, and then impregnated with liquid unsaturated polyester resin composition. As a result, flexural strength of the obtained laminate is increased 1.5 times with that without pretreatment.

According to (III), Kraft paper substrate is pre-impregnated with 10% by weight of polyethylene glycol, and then impregnated with liquid unsaturated polyester resin composition. As a result, impact strength of the obtained laminate is increased about 2 times compared with that without pre-impregnation.

Furthermore, according to (VII), glass cloth substrate is pre-impregnated with polyamide resin by 30% of the liquid epoxy resin by weight, and then impregnated with liquid epoxy resin. As a result, the problems caused by the short pot life of the liquid epoxy resin can be prevented in vessels 8, 9 and impregnating devices 2.

The amount of pre-impregnating agent finally deposited in substrate is preferably less than 50% of the substrate by weight, and an excessive amount may occasionally affect the succeeding impregnation with the liquid resin adversely.

The above pre-impregnation treatment is important for the reason described below.

When paper mainly composed of cellulosic fiber is impregnated with a liquid unsaturated polyester resin composition, the conventionally obtained laminate is sufficient under normal conditions, in various properties including electrical insulation, solder dip thermal resistance, copper foil peel strength, punching processability and mechanical strength, while it has the drawback of a decrease in performance of the laminate by moisture absorption. This is considered to be because, although the cured unsaturated polyester resin itself is excellent in electrical insulation, thermal resistance, and moisture- and water-resistance, it is rather poor in affinity with the cellulosic fiber composite of the paper substrate, and consequently causes interfacial release between the resin and the cellulosic fiber upon humidifying. This subsequently allows the moisture content of the laminate to increase, resulting in deterioration of various properties of the laminate.

As attempts to prevent such imperfections, several propositions have been made so far. For example, paper substrate was preliminarily treated with methylol melamine or methylol guanamine (Japanese examined publication SHO.38-13781), or acetalized with formaldehyde (Japanese examined publication SHO.40-29189, or cellulosic substrate was etherized with N-methylol acrylamide, washed and dried, and impregnated with diallyl phthalate resin (Japanese examined publication SHO.39-24121).

However, both of the above methods with methylol melamine or methylol guanamine and with formaldehyde have the drawback that they require the use of an excessive amount of such agents, rendering the laminates too hard to be punched with ease.

The treatment with N-methylol acrylamide has a drawback in that the reaction takes a long time and requires complicated procedures such as a washing process. In addition, the laminates obtained are poor in punching processability.

After many experimental studies, we have found a way of protecting the laminate from deterioration of properties upon humidifying. In this method, cellulosic substrate is dipped into a solution of an N-methylol compound that has an unsaturated bond capable of copolymerizing with a monomer, for example, a vinyl monomer contained in the liquid unsaturated polyester resin composition. Electrical laminate boards obtained in this way exhibit excellent properties under humid conditions as well as under normal conditions. It should be noted that the drying treatment does not encourage reaction between the N-methylol compound and cellulose, but only removes solvents such as water or alcohol.

Unsaturated polyester resin useful in the present invention may be liquid or solid, preferably liquid at room temperature. Its molecular constitution may be, for example, composed of a well-known recurring unit:

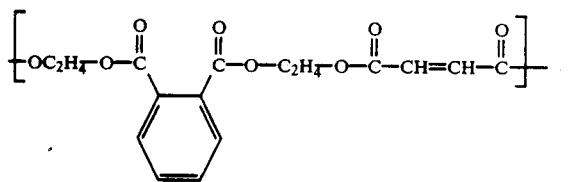

The unsaturated polyester resin is synthesized with the use of diol compounds, saturated polybasic acids, and unsaturated polybasic acids in ways well-known in the art. Useful diol compounds include ethylene glycol, propylene glycol, diethylene glycol, 1,4-butanediol, and 1,5-pentanediol; useful saturated polybasic acids include phthalic anhydride, isophthalic acid, terephthalic acid, adipic acid, sebacic acid, and azelaic acid; and useful unsaturated polybasic acids include maleic anhydride and fumaric acid. The liquid unsaturated resin composition is prepared by mixing the acid said unsaturated polyester resin with cross-linking monomers.

As regards the cross-linking monomer, various polymerizable monomers are useful. Styrene is the most common, but α-methylstyrene, vinyltoluenes, chlorostyrenes, divinylbenzenes, $C_1 \sim C_{10}$-alkyl acrylates, $C_1 \sim C_{10}$-alkyl methacrylates, diallyl phthalate, triallyl cyanurate and the like are also useful. These polymerizable monomers are used in an amount of 20 to 50% by weight based on the unsaturated polyester resin. It should be specially mentioned that a mixture of styrene and divinylbenzenes is readily copoplymerizable and contributes to improvements in the mechanical strength of the final product.

To the liquid thermosetting resin composition, a curing catalyst which is usually an organic peroxide compound and, if necessary, a curing accelerator are added. For the purpose of curing an unsaturated polyester resin, the curing catalyst is preferably selected from the organic peroxide compounds cited below. It should not however be limited thereto, but may be selected among known other types of curing catalyst, such as light-sensitive or irradiation-sensitive ones.

Although there are a number of known organic peroxide compounds for curing unsaturated polyester resin, the selection therefrom is important in securing the novel electrical laminate production by the nonpressure curing process of the present invention.

In general, an organic peroxide compound leaves traces of its decomposition residues in the body of the laminate. Such decomposition residues may occasionally evaporate with unpleasant odors at temperatures of from 100° C. to 260° C., which are those usually employed in fabrication processes of electrical insulation laminates or copper clad laminates.

According to experiments by the inventors, the single or combined use of certain organic peroxides selected from aliphatic peroxides, especially from aliphatic peroxyesters, has been found suitable for producing such laminates with little or no odor.

Said aliphatic peroxides are those having a general formula as follows:

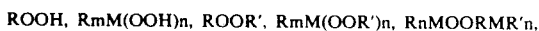
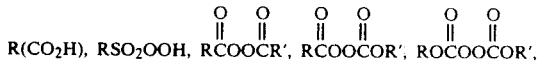
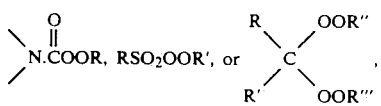

wherein R, R' and R''' represent aliphatic hydrocarbon groups, and M is a metal or metalloid atom.

Specifically, they include di-t-butyl peroxide, 2,5-dimethyl-2,5-di(t-butylperoxy)hexane, acetyl peroxide, isobutyryl peroxide, t-butylperoxy-2-ethylhexanoate, etc.

Said aliphatic peroxyesters are those having a general formula as follows:

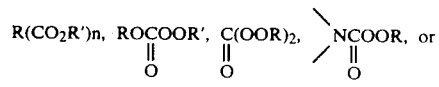

where R and R' represent aliphatic hydrocarbon groups, and n is an integer from 1 to 4.

Specifically, they include t-butylperoxy acetate, t-butylperoxy isobutyrate, t-butylperoxy 2-ethylhexanoate, 5-butylperoxy laurate and the like.

The reason why such aliphatic peroxides and peroxyesters are preferable is probably because, upon heat decomposing, they do not generate volatile aromatic compounds that could be responsible for odors.

Conditions of temperature and time for curing liquid resin composition largely depend upon the type of organic peroxide used. In the present invention, the temperature is preferably lower than 100° C. at the initial curing step, so that generation of bubbles due to volatilization of existing liquid copolymerizable monomer can be prevented, and thereafter the temperature preferably lies in the range 50° C. to 150° C. to make curing complete at atmospheric pressure.

In electrical laminate boards and copper clad laminate products, properties such as thermal resistance, thermal and humid dimensional stabilities, punching processability, bonding strength between substrate and cladding copper, and electrical insulation properties are very important. For the purpose of improving these properties, various additives and fillers may be incorporated into the above liquid unsaturated resin composition, without departing from the scope of the present invention.

As regards impregnating epoxy resin, bisphenol A-type epoxy resins, novolak-type epoxy resins, and their mixtures are useful, and they are mixed with a reactive diluent as necessary, and with a curing agent. The epoxy resin itself however is preferably liquid at room temperature.

As regards a curing agent, most of the well-known agents of both the acid-curing type and amine-curing type are applicable in the present invention.

In the present invention, however, the use of epoxy resin liquid composed of epoxy resin and acid anhydride-type curing agent is especially suitable, because the viscosity of the epoxy resin liquid at 25° C. can be maintained at from 0.5 to 30 poise, preferably from 1 to 15 poise, this being appropriate for impregnation of the substrate.

There are a number of various epoxy-curing agents of the amine type, amide-amine type, dicyandiamide type, imidazole type, etc. on the market. The use of these agents with bisphenol A-type epoxy resin of high quality makes the viscosity of the resin liquid difficult to control within a certain appropriate range. This difficulty could e alleviated by adding a large amount of diluent, which however might cause, in turn, significant deterioration in the properties of the product.

In addition, curing agents of the amine type and amide amine type generally have a drawback in that they shorten the pot life of resin, whereas curing agents of the dicyandiamide type and imidazole type have the drawback or requiring prolonged high temperatures for curing.

The use of curing agents of the acid anhydride type has neither of these drawbacks, and is therefore most suitable.

The liquid epoxy resin composition used in the present invention is more definitely described as follows.

Bisphenol A-type liquid epoxy resins are generally suitable, but also others such as bisphenol F-type and novolak-type resins are useful. If necessary, their blends with solid epoxy resin or diluent may be acceptable. Useful acid anhydride-type curing agents include phthalic anhydride, tetrahydrophthalic anhydride, hexahydrophthalic anhydride, methyl-tetrahydrophthalic anhydride, methyl-hexahydrophthalic anhydride, methyl-endic anhydride, and their mixtures. However, methyl-tetrahydrophthalic anhydride, methyl-hexhydrophthalic anhydride, and methyl-endic anhydride, each of which is liquid at room temperature, are especially suitable for the present invention.

As curing accelerators, commercially available agents such as 2-ethyl-4-methylimidazole, boron trifluoride complex compounds, tertiary amines and their salts, benzyl dimethylamine, and myristyl dimethyl benzyl ammonium chloride are useful.

As the sheet substrate, a long continuous cloth of glass fiber, specially pretreated with silane coupling agent as previously described, is preferable.

The above N-methylol compounds, which are used as the pre-impregnating agent and have an unsaturated bond copolymerizable with vinyl monomers, include various types of compound and mixtures as follows:

(I) Modified aminotriazine methylol compounds. These compounds are derived from methylol compounds of aminotriazines such as guanamines and melamines, whose methylol groups may have optionally been etherified, partially or totally by lower alcohols such as methanol, by introducing unsaturated bonds copolymerisable with vinyl monomers, and therefore include aminotriazine methylol compounds partially esterified with unsaturated carboxylic acids such as acrylic acid and itaconic acid; aminotriazine methylol compounds partially etherified with unsaturated alcohols such as allyl alcohol; condensates of aminotriazine methylol compounds with unsaturated carboxylic acid amides such as acrylamide and methacrylamide; and condensates of aminotriazine methylol compounds with unsaturated epoxy compounds such as glycidyl methacrylate.

(II) Amide methylol compounds having a general formula:

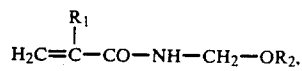

where $R_1$ is a hydrogen atom or methyl group, and $R_2$ is a hydrogen atom or $C_1 \sim C_3$-alkyl group.

Among these compounds, N-methylolacrylamide, N-methoxymethylolacrylamide, N-butoxymethylolacrylamide, N-methylolmethacrylamide, N-methoxymethylolmethacrylamide, and N-butoxymethylolmethacrylamide are preferable. Also mixtures of condensates of the above two or more compounds are useful.

(III) Mixtures of a and b described below, as replacements of modified aminotriazine methylol compounds specified in (I).

(a) N-methylol compounds such as aminotriazine methylol compounds having no unsaturated bonds copolymerizable with vinyl monomers.

(b) Modifying agents for N-methylol compounds (a), that is, compounds having both a group condensable with or additionable to N-methylol compounds (a), and an unsaturated bond copolymerizable with vinyl monomers. For example, unsaturated carboxylic acids such as acrylic acid and itaconic acid, unsaturated alcohols such as allyl alcohol, unsaturated carboxylic acid amides such as acrylamide and methacrylamide, and unsaturated epoxy compounds such as glycidyl methacrylate are included.

The pretreatment of paper substrate with a solution of the mixtures specified in (III) also forms one of the best modes for carrying out the present invention, and exhibits almost similar effects to the pretreatment with compounds specified in (I) and (II). The reason is considered to be because, while the pretreated paper is dried and subsequently impregnated with liquid unsaturated polyester resin composition and then cured, reactions take place between the N-methylol compounds specified as (a) in (III), and the modifying agents specified as (b) in (III).

One of the main purposes of the present invention is to improve the combination between paper substrate and unsaturated polyester resin, and thereby to prevent deterioration of product properties when humid. In order to attain this objective, paper substrate has to be subjected to treatment with a compound specified in (I) or (II), which has both an N-methylol group capable of combining with cellulose, and an unsaturated bond capable of copolymerizing with a vinyl monomer (i.e. a cross-linking agent for unsaturated polyester resin); or subjected to treatment with the mixture specified in (III), which is composed of an N-methylol compound as in (a) having no unsaturated bond copolymerizable with the said vinyl monomer, and the modifying agent as in (b) for the said N-methylol compound. In contrast, the pretreatment with a compound having only either an N-methylol group or an unsaturated bond copolymerizable with the vinyl monomer is not sufficient in effect. For example, the sole use of methylol melamine having only the N-methylol group, and the sole use of acrylamide having only the unsaturated bond, have both been found to yield laminates with insufficient humid properties.

The solution of the treating agent specified in (I), (II) and (III), is prepared of such a concentration that the deposited amount in paper substrate after drying may result in from 3 to 30 parts, preferably from 6 to 20 parts per 100 parts of paper substrate on a dry basis. Deposition of less than 3 parts is almost ineffective, while that of more than 30 parts makes laminates too brittle to be punched with ease.

For a solvent of the above treating agent, water, alcohols, ketones, and esters are useful. In order to promote etherification of cellulose with the N-methylol group of the treating agent, addition of an acid condensation catalyst, and elevation of the curing temperature of pretreated paper may be both effective. In these cases, although the etherification reaction of cellulose may possibly partially take place prior to the subsequent impregnation and curing reaction of unsaturated polyester resin, this has been found to produce no special effects.

According to the present invention, in the process of pretreating the paper substrate, promotion of the etherification reaction of cellulose by adding a catalyst is not always necessary, but simply the deposition of the treating agent into paper is efficient to improve properties of products when humid. Adversely, the addition of catalysts of certain types may result in a deterioration in product properties such as electrical insulation and punching processability.

Further, such agents as a polymerization inhibitor, polymerization catalyzer, surface active agent and plasticizer may be effectively added into the solution of the above treating agent, if necessary.

For example, substrates commonly used in the art, such as kraft paper, cotton linter paper and fibrous cloth, are impregnated with the solution of the above treating agent by means of a dipping bath, roll coater or spray, and dried to be converted to the pretreated substrate. This drying procedure is only necessary for removing the used solvent, but not for making the cellulose of the substrate react with the treating agent.

Needless to say, such compounds as methylol melamine and methylol guanamine, which had been disclosed in literature as cited above, belong to the group of methylol compounds having no unsaturated bond copolymerizable with vinyl monomer. In an attempt by the inventors, paper substrate was pretreated with these compounds, and then, according to the present invention, impregnated with liquid unsaturated polyester resin composition. Laminates thus obtained were found to have considerably improved moisture- or water-resistance, and, in comparison with those obtained without the said pretreatment, to show smaller decreases in humid electrical insulation and solder thermal resistance. These laminates, however, were found to be impractical in respect of punching processability because they readily cracked on impact. On the other hand, punching processability was considered to largely depend upon the qualities of the impregnating unsaturated polyester resin used. In fact, according to the evaluation of a number of grades or commercially available unsaturated polyester resins, there were none among then that could yield excellent punching processability, even though applied to the said pretreated substrate.

After many elaborate studies from these points of view, the inventors reached the following finding. That is, even when known methylol compounds, such as methylol melamine and methylol guanimine, that have no unsaturated bonds copolymerizable with vinyl monomers, are employed as pretreating agent, the additional use of a higher aliphatic derivative that has one or more functional groups, such as hydroxyl, carboxyl, amino and amide groups, capable of condensing with the said methylol compounds, can give laminate products both of excellent punching processability and excellent humidity resistance. The higher aliphatic derivative may be incorporated with the said methylol compounds by means of mixing or condensation.

Further detailed descriptions are given below.

The methylol compounds, such as methylol melamine and methylol guanamine, that have no unsaturated bonds copolymerizable with vinyl mononers, more definitely are either early condensates of melamine, or guanamine compounds, for example, formoguanamine, acetoguanamine, propioguanamine, benzoguanamine and adipodiguanamine with formaldehyde, or their derivatives obtained by partial or total etherification of their methylol groups with lower alcohols such as methanol and butanol.

The above higher aliphatic derivatives, which are mixed or condensed with said methylol compounds for the purpose of improving punching processability, include saturated fatty acids such as caprylic acid, capric acid, lauric acid, myristic acid, palmitic acid, and stearic acid; unsaturated fatty acids such as oleic acid, erucic acid, linoleic acid, eleostearic acid, and linolenic acid; esters of the above saturated and unsaturated fatty acids with polyols such as ethylene glyycol, polyethylene glycol, propylene glycol, glycerol, pentaerythritol, and sorbitol; amides of the above saturated and unsaturated fatty acids; saturated and unsaturated higher alcohols such as caprylic alcohol, lauryl alcohol, myristyl alcohol, cetyl alcohol, stearyl alcohol, oleyl alcohol, and linoleyl alcohol; ethers of the above higher alcohols with the above polyols; derivatives from the above higher alcohols, such as aliphatic amines, and the like. In addition, hydroxyfatty acids such as ricinoleic acid and their derivatives are also useful for the same purpose. In effect, the essential feature of an agent for improving punching processability is that its molecule has both a group such as hydroxyl, carboxyl, amino and amide capable of condensation with a methylol group of methylol melamine, methylol guanamine, and the like, and a long-chain alkyl group capable of making the intermolecular cohesion moderate.

There are a great number of higher aliphatic compounds which meet the above molecular constitutional conditions. Nevertheless, according to screening studies so far, it has become apparent that the use of compounds having an aliphatic group of 8 or more carbon atoms tends significantly to improve punching processability of the resulting laminates, and that the use of compounds having an aliphatic group of 18 carbon atoms and one unsaturated bond, such as oleic acid, oleyl alcohol, and their derivatives, such as oleic monoglyceride, oleic diglyceride, oleic amide, and oleyl amine, presents a well-balanced combination of properties of laminate products, and thus constitutes a suitable substance for use in connection with the present invention.

The optimal amount of the above agent used for improving punching processability depends upon the glass transition temperature of the impregnating unsaturated polyester resin, but usually falls in the range of 3 to 40 parts per 100 parts of methylol melamine or methylol guanamine. The agent can be incorporated in solution or suspension with methylol melamine or methylol guanamine, and alternatively applied in the form of a preliminarily prepared condensate with methylol melamine or methylol guanamine. As solvents, water, alcohols, ketones and esters are useful.

The whole concentration of the pretreating media is desirably kept within a range of 3 to 30 parts, preferably 6 to 20 parts per 100 parts of cellulosic substrate on a dry basis, as in the case of N-methylol acrylamide mentioned previously. Deposition of less than 3 parts is almost ineffective, while that of more than 30 parts makes laminates too brittle to be punched with ease.

Cellulosic paper substrate such as kraft paper and cotton linter paper, or cellulosic cloth substrate made from cotton or rayon, is treated with a solution or suspension that has been prepared under the conditions mentioned above, by means of a dipping bath, roll coater or spray, and dried to remove the solvent. Usually, the drying temperature is preferably 70° to 150° C., and the drying time is preferably 1 to 60 minutes. The pretreated substrate is then subjected to impregnation with the liquid unsaturated polyester resin composition mentioned previously.

Thus, two types of pretreatment (i.e., preimpregnating treatment) of paper substrate were described as above.

These processes provide the laminate product with excellent punching processability; however, the use of unsaturated polyester resin whose post-curing glass transition temperature is 20° to 80° C. is also preferable for securing low-temperature punching processability.

According to studies by the inventors, the use of unsaturated polyester resin whose post-curing glass transition temperature is 20° to 80° C., is desirable for securing excellent punching processability in common, independently of the above mentioned pretreatment of paper substrate.

In practical use, electrical clad or unclad laminates are often trimmed or provided with holes or slots by punching, and therefore are required to have excellent punching processability. Recently in accordance with the miniaturization of electronic parts and densification of circuits, such requirements have been increasingly important.

Conventionally, reinforced unsaturated polyester resin laminates have been produced by impregnating the substrate with a solution of crystalline or solid unsaturated polyester resin containing a cross-linking agent, drying the substrate to form prepreg, and then curing the stacked prepreg under heat and pressure. Laminates obtained have had excellent thermal resistance due to the high post-curing glass transition temperature of the unsaturated polyester resin used, but have been difficult to be punched out, especially at lower temperatures of 50° to 80° C.

After elaborate studied to resolve the problem of punching processability, we have found that there is a close correlation between the glass transition temperature of a cured unsaturated polyester resin composition and the optimal temperature for punching the resulting laminate.

Then, we have found that the temperature for punching should be equal or close to the above glass transition temperature, within a difference of 20° C., preferably 10° C. For example, when an unsaturated polyester resin composition with a post-curing glass transition temperature of 20° to 80° C., preferably 30° to 70° C., is used, the resulting laminate exhibits excellent low-temperature punching processability at temperatures within 20° C. of said glass transition temperature, preferably within 10° C. of said glass transition temperature.

The punching processability referred to herein may be examined and evaluated in accordance with ASTM D-617-44 "Punching Quality of Phenolic Laminated Sheets". When a laminate produced as herein described is ranked from "Excellent" to "Fair" in overall evaluation on its edges, surfaces and holes, its punching processability is signified as "Good".

Where punching processability at low temperature is regarded as important, an unsaturated polyester resin composition with a post-curing glass transition temperature of 20° to 80° C., preferably 30° to 70° C., is useful. If the said temperature exceeds 80° C., punching at low temperatures could result in such serious defects as deficiencies or bores along edges, cracks or swellings on edges or around holes, defects in hole walls, expansion around holes, and tapering off of holes. When punching is performed at temperatures lower than 20° C., swellings around holes and tapering off of holes becomes much more conspicuous.

In the latter case, improved results can be obtained by cooling the testing piece, however this is not practical.

When the boards are impregnated with unsaturated polyester resin composition with a glass transition temperature of 30° to 70° C., products of good quality for low-temperature punching are obtained.

In the case of low-temperature punching, for the types of products usually applied in the art concerned, it has been common practice to use a punching temperature from about 50° C. to about 80° C., while, in accordance with the present invention, the use of temperatures ranging from about 30° C. to about 80° C. is possible for punching with ease and with excellent results.

Furthermore, when punching processability at low temperature is regarded as important, various properties of the cured resin composition and the resulting laminate product largely depend upon the type and ratio of glycols, saturated and unsaturated dibasic acids, and cross-linking monomers used. However, all types of unsaturated polyester resins mentioned previously are useful when they are incorporated with cross-linking monomers so that the post-curing glass transition temperature may range from 20° to 80° C., preferably from 30° to 70° C. For example, unsaturated polyester resins composed of the following components (molar ratio given in parentheses) are all applicable:

diethylene glycol, isophthalic acid and maleic anhydride (3:2:1);

propylene glycol, isophthalic acid and maleic anhydride (2:1:1);

1,3-butanediol, isophthalic acid and maleic anhydride (2:1:1);

1,4-butanediol, isophthalic acid and maleic anhydride (2:1:1)

dipropylene glycol, isophthalic acid and maleic anhydride (2:1:1);

diethylene glycol, isophthalic acid and maleic anhydride (2:1:1);

propylene glycol, phthalic anhydride and maleic anhydride (2:1:1);

propylene glycol, glutaric acid and maleic anhydride (2:1:1);

propylene glycol, succinic acid and maleic anhydride (2:1:1);

propylene glycol, pimelic acid and maleic anhydride (2:1:1);

propylene glycol, adipic aid and maleic anhydride (2:1:1);

propylene glycol, sebacic acid and maleic anhydride (2:1:1); and propylene glycol, azelaic acid and maleic anhydride (2:1:1).

These unsaturated polyester resins are incorporated, for example, with styrene at a ratio of 65 to 35 by weight to prepare a liquid resin composition.

For example, a liquid resin composition prepared from the resin composed of propylene glycol, isophthalic acid and maleic anhydride (2:1:1) has a post-curing glass transition temperature of about 70° C., and exhibits excellent low-temperature punching processability when evaluated at 75° C.

As for the cross-linking monomer, styrene is useful as is known in the art, but other vinyl compounds such as vinyltoluene, chlorostyrene, dichlorostyrene, divinylbenzene, vinyl acetate, alkyl acrylates, alkyl methacrylate, diallyl phthalate, triallyl cyanurate or their mixtures with styrene are useful as well. Each of these polymerizable monomeric components are incorporated with the above unsaturated polyester resin, so that the post-curing glass transition temperature of the resulting unsaturated polyester resin composition may range from 20° C. to 80° C., preferably from 30° C. to 70° C.

For example, liquid resin compositions may be formulated with the use of an unsaturated polyester resin, which is prepared from diethylene glycol, isophthalic acid and maleic anhydride (3:2:1), with styrene and butyl acrylate in three ways as shown in Table 1. The resulting post-curing glass transition temperature ($T_g$) are given in addition.

TABLE 1

| Resin compositions | No. 1 | No. 2 | No. 3 |
|---|---|---|---|
| Components (weight %) | | | |
| Polyester resin | 60 | 60 | 50 |
| Styrene | 35 | 30 | 30 |
| Butyl acrylate | 5 | 10 | 20 |
| $T_g$ (°C.) | 50 | 45 | 35 |

Blending ingredients such as rubbers, plasticizers and fillers with the above resin compositions may be possible, provided that the finally cured resin compositions are qualified as described herein. In the case of rubber, polybutadienes, butadiene copolymer rubbers, or their maleic-modified products may be used; in the case of plasticizers, commercial products from adipic or phthalic acid and glycols, and epoxidized soybean oil may be used; and in the case of fillers, certain types of commercial calcium carbonate, silica and titanium dioxide may be useful, respectively.

As regards the substrate, various sheet materials well-known in the art are useful as mentioned previously, but paper material is especially desirable for use in connection with the present invention.

Unclad laminates and copper clad laminates produced in the above-mentioned ways according to the present invention exhibit desirable punching processability from 30° to 80° C., being free from drawbacks common to conventional unsaturated polyester laminates in this respect. Certain laminates obtain are superior to coventional phenolic laminates in punching processability.

When a sheet substrate is subjected to impregnation with a liquid resin composition according to the present invention, it is necessary to take the high viscosity of the liquid resin composition into consideration, in contrast with the case of conventional impregnation with liquid varnish.

Figure 4:
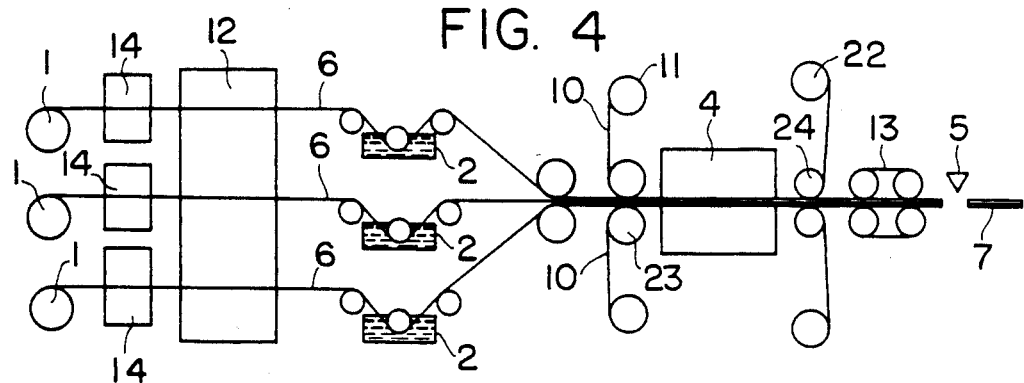
FIG. 4, FIG. 5 and FIG. 6 represent other apparatus used in the present invention.
Figure 5:
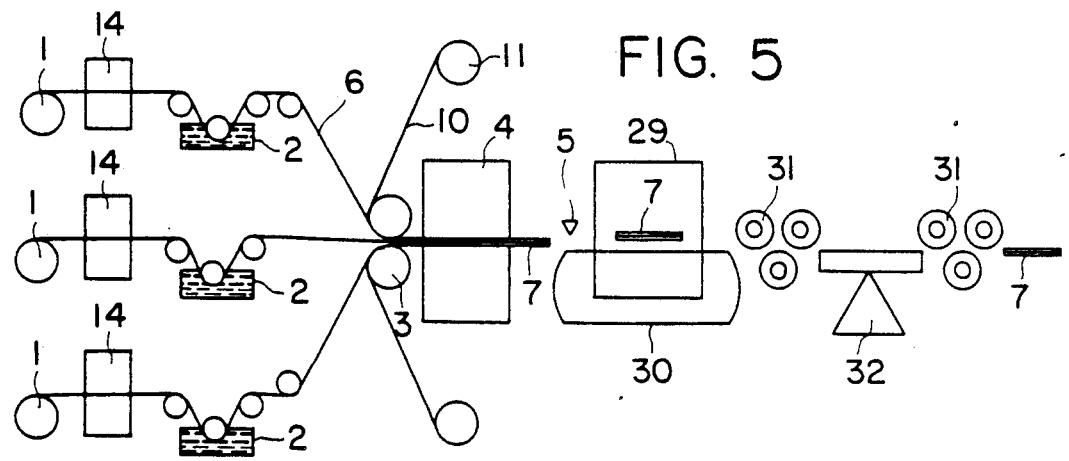
Figure 6:
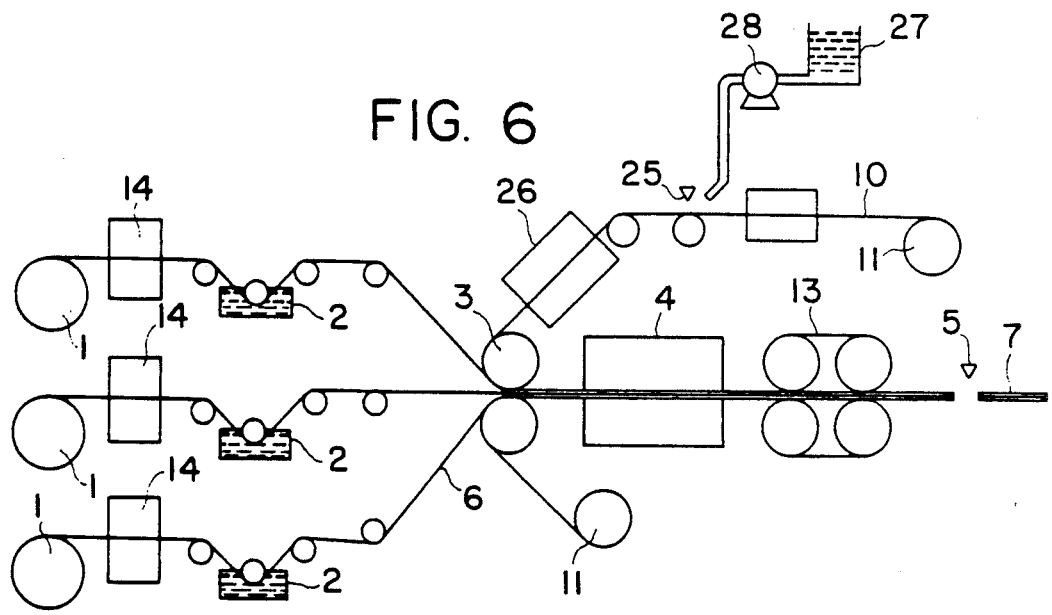

As an impregnating device 2, both the dipping bath as shown in FIG. 4 to FIG. 6, and the curtain flow applicator as shown in FIG. 1 are useful.

In the dipping bath, the substrate is forced through the bath of resin liquid. Care should be taken since this method tends to leave air bubbles entrapped within the substrate.

In the curtain flow method, the substrate is fed a curtain flow of the liquid resin onto its upper surface while moving horizontally. This method has the advantage of being able to impregnate several sheet substrates concurrently under similar conditions, and to exclude entrapped large air bubbles with ease, but has the disadvantage that a number of fine bubbles still remain within the substrate, especially the paper substrate, even through to the last stage of impregnation from the upper surface through to the lower surface. Most of these bubbles gradually disappear in 7 to 20 minutes. When the sheet substrates are, however, combined into a unitary stack and cured before the complete disappearance of bubbles, the resulting laminate unavoidably includes sustained bubbles. This inclusion leads to a decrease in the thermal conductivity of the laminate, and consequently causes undesirable over-heating of electronic parts mounted on the laminate. It also adversely affects on the transparency and appearance of the laminate. Even though the impregnation ability may, needless to say, depend upon such parameters as applied pressure, wettability of substrate by resin liquid (i.e., contact angle), applied time as well as viscosity of the resin liquid, the general mode of the impregnation process is similar to the above.

The long duration of time required for the impregnation process necessarily causes the entire line speed to a low level. Needless to say, these effects are undesirable from the view point of securing efficient productivity.

It has been generally considered that the number of bubbles remaining within the final laminate depends largely upon the impregnating conditions and the heat pressure conditions during curing, ad therefore that a longer impregnation time reduces the number of bubbles within the impregnated substrate, and a higher compressing pressure promotes dissolution of remaining bubbles into the resin material. Use of prolonged impregnation time and higher pressure, however, is apparently accompanied with the disadvantages of lowering producitivity and expanding apparatus.

According to the present invention, it is possible to make the laminate almost free from remaining bubbles by exposing the liquid resin composition to a reduced pressure, even with no application of compressing pressure during the curing step.

Further, such a reduced-pressure treatment is effective in reducing impregnation time, for example, cutting this time to ⅓ to 1/10 of the time it would otherwise have taken.

The reduced-pressure treatment referred to in the present invention requires exposing the liquid resin composition to a pressure lower than atmospheric pressure. For example, a liquid resin composition containing a curing agent is placed in a pressure vessel, and the space in the vessel is evacuated. Alternatively, a liquid resin composition is intermittently poured, continuously jetted, or otherwise added into a preliminarily evacuated vessel. In either case, the reduced pressure-treated liquid resin composition may be, upon impregnating, subjected to contact with the atmosphere, which has, however, no adverse effect. Alternatively, a substrate already impregnated with the liquid resin composition may be subjected to reduced pressure treatment in an evacuated vessel.

The reduced pressure-treated liquid resin composition can be exposed, if necessary, to atmosphere pressure for about 30 to 60 minutes with no adverse effect.

The degree of reduced pressure applied may depend on the vapor pressure of the solvent and monomer components contained in the liquid resin composition, but is preferably 2 to 100 mmHg. Also the treatment time may differ between treating methods, but a resident time for several minutes in the evacuated vessel may be sufficient in the dropwise adding method.

The said reduced-pressure treatment is especially useful for application to a liquid resin composition which is free of solvent and is capable of curing without generating gaseous and volatile byproducts. This is because, in such a case, the conditions of reduced-pressure treatment are not restricted by the existence of a volatile solvent and the secondary generation of bubbles during the curing process is effectively prevented without the application of pressure.

It is preferable according to the present invention to use unsaturated polyester resin of liquid state with a viscosity of from about 0.1 to 30 poise at room temperature.

As regards the cross-linking monomer, styrene that is in common use for unsaturated polyester resins and has a vapor pressure of about 6 mmHgh at room temperature, is preferable also in the present invention, and the ratio of styrene to the whole liquid resin composition is preferably from 30 to 50% by weight. Then the reduced-pressure treatment may be efficiently carried out by supplying the styrene-containing composition into a vessel wherein it is subjected to a pressure of from 2 to 30 mmHg.

FIG. 1 shows an illustration of apparatus in which a liquid resin composition is successively treated under a reduced pressure as mentioned above, and continuously applied onto several sheet substrates moved in parallel.

The storing vessel 8 of liquid resin composition is connected to the top of a pressure-reducing cylindrical closed vessel 9 by a pipe 15. The pipe 15 is open at one end at the bottom of the storing vessel 8 and, at the other end, jointed with the nozzle, which is arranged in the uppermost part of the pressure-reducing vessel 9 via the valve 16. The liquid resin composition is transferred from the storing vessel 8 through the pipe 15, and jetted out of the nozzle by a negative pressure in the pressure-reducing vessel 9. The rate of jetting is adjusted manually by a valve 16 or a supply pump (not shown in the figure).

The uppermost part of the pressure-reducing vessel 9 is connected to a vacuum pump 19 of oil-rotation type via leak valve 17 and cold trap 18. The inner pressure of the vessel 9 is maintained negative, preferably lower than 30 mmHg. This pressure is checked with a manometer 20.

The bottom of the vessel 9 is connected with the impregnating devices 2 via a delivery pump 21.

By being jetted out of the nozzle, the liquid resin composition falls down into the upper evacuated space of the vessel 9 with a falling head of about 50 to 100 cm. By this means, the liquid resin composition is reduced-pressure treated fully and effectively, and constantly stored in the vessel 9 so as to be steadily supplied to the impregnating devices 2.

When it is necessary to adjust the back pressure in accordance with the capacity of the pump 21, it may be effective to place the vessel 9 at a higher level than the pump 21, or to preserve some of the liquid resin composition in a spare vessel (not shown in the figure).

As impregnating device 2, either a curtain flow applicator or a dipping bath can be used. But certain types of dipping bath are not preferable because of possible stagnation of liquid resin composition therein, whereas the curtain flow applicator is preferable. Then the liquid resin composition is directly applied onto the sheet substrate, and the overflowing portion is recovered, returned to the storing vessel 8 and reused.

A certain number of impregnated substrates 6 are continuously transferred in parallel to the laminating device 3, which is, for example, composed of a pair of rolls, jointed together surface-to-surface, and simultaneously sandwiched between two film coverings or cladding metal foils 10, then guided into the heat curing oven 4 under unpressurized conditions, and formed into a laminate. After curing, the laminate is cut into a predetermined length.

The above reduced-pressure treatment of the liquid resin component is applicable regardless of the types of substrates conventionally used in the art, including paper mainly composed of cellulosic fiber, glass cloth, fiber glass nonwoven fabric, asbestos cloth, synthetic fabric, and synthetic nonwoven fabric, but it is especially suitable when using cellulosic paper and glass cloth.

It is surprising that excellent productivity is secured by introducing the said reduced-pressure treatment. Although the reason for this fact has not been made fully clear, it may be supposed that the reduced-pressure treatment makes the amount of air dissolved in the liquid resin composition decrease, and therefore gives the liquid resin composition a reserve capacity to dissolve air, which enables the air confined in the substrate to dissolve at an effective rate, resulting in the disappearance of bubbles within the whole laminate. The reduced-pressure treatment is probably effective in excluding air bubbles that were entrapped when such agents as catalysts and modifiers were mixed into the composition, but this effect is not a feature of the present invention, because reduction of pressure is well-known means for deaeration of still viscous resin liquids.

The reduced-pressure treatment conventionally employed for the purpose of deaeration may be considered as different from that in conducting the present invention. The reason may be apparent from the following instance.

If a liquid unsaturated polyester resin composition that has been preliminarily well deaerated by standing still and has a viscosity of about 4 poise is used for impregnation of paper substrate, the impregnation speed may not be increased by this deaeration. On the other hand, if the liquid resin composition that has been reduced-pressure treated according to the present invention and then intentionally aerated by agitation is used for impregnation, then the time for disappearance of bubbles within the impregnated paper substrate is significantly shortened.

In effect, by introducing the reduced-pressure treatment according to the present invention, the time for disappearance of bubbles within the impregnated paper substrate is shortened usually to less than 7 minutes, at most, to 2 to 5 minutes.

This treatment is similarly effective when a glass cloth is impregnated with a liquid epoxy resin composition.

The degassing treatment of the present invention is desirably conducted with means for increasing the total surface area of liquid resin composition to be treated. For example, spraying or jetting the liquid resin composition into a pressure-reduced vessel is much preferably to standing it still therein.

The above treatment is invariably effective, even when the liquid resin composition to be treated contains bubbles or entraps bubbles in the course of delivery. It is also effective in decreasing the amount of dissolved oxygen therein that adversely affects the radical curing reaction of unsaturated polyester resin.

Commercially available liquid unsaturated polyester resins usually contain water in an amount of about 0.03 to 0.1% by weight. The above degassing treatment is also desirable for decreasing this water content to less than 0.04% by weight, preferably to less than 0.02% by weight, so as to minimize the generation of bubbles of moisture and the inhibition of curing reaction by moisture.

As described previously, several impregnated sheet substrates are converged and joined together into a unitary member or stack with the aid of a pair of rolls or a roller coupled with a blade.

In accordance with the present invention, the final resin content in the impregnated substrate is adjusted at 10 to 90%, preferably from 20 to 80%, more preferably from 30 to 70%, based upon the total weight of impregnated substrate. This may be effected by one of the following methods or a combination thereof.

I. Each substrate is fed prior to the lamination with each other, with an excess of liquid resin at the impregnating station 2, and then passed through a pair of scraping blades defining adjustable clearance 33 for scraping off the excessive resin, as shown in FIG. 1.

II. After the impregnation each substrate is passed between a pair of rollers 34 to squeeze out excessive liquid resin as in FIG. 4, and then laminated with each other at the laminating station 3.

III. The nip of clearance of laminating rollers 3 is made adjustable in order that the lamination of plural substrates and the removal of excessive liquid resin may be performed simultaneously at the lamination station 3.

IV. When the combined substrates are sandwiched between a pair of covering sheets 10 by a separate pair of rollers 23 as shown in FIG. 4, the nip or clearance of the rollers 23 is made adjustable to remove excessive liquid resin.

V. Before a covering sheets 10 is applied onto the both sides of the laminate, the interface between the substrate and the covering sheet is replenished with an additional amount of liquid resin from a resin-replenishing means 35 as shown in FIG. 4.

As stated before, the final resin content is adjusted at 10 to 90%, preferably from 20 to 80%, more preferably from 30 to 70% based upon the total weight of the impregnated substrate. The resin content in a given laminate is an important factor which controls various properties of the finished laminate. Since substantially no pressure is applied on the laminate in the thickness direction during the curing step thereof, it is impossible for the present invention to control the resin content by pressing out excessive resin during the curing step. Accordingly, the final resin content in the impregnated substrated is adjusted within the stated range at least when the laminate of impregnated substrates is given a pair of covering sheets on its both sides and made ready to cure as such.

The term "resin content" used herein refers to a ratio x represented by the equation: Percent $x = A/(A+B) \times 100$, wherein A is the weight of resin and B is the weight of substrate.

Insufficient resin contents result in poor quality of the product, while excessive resin contents often cause various disadvantages such as spilling of the liquid resin out from the edges of the uncured laminate and the like.

The stack of impregnated sheet substrates is, simultaneously or subsequently to joining, sandwiched between two film or sheet coverings. Then it is desirable that the film or sheet coverings extend a little over both edges of the stack, so that the possible exudate of liquid resin composition on the edges may be supported therebetween.

According to the present invention, said film or sheet coverings can be widely selected from various materials, conforming to the requirements of the product, because the curing process is performed substantially without application of continuous compression. For example, various kinds of release paper of cellophane of 10 to 200 μm thickness, synthetic films of Teflon, polyester and the like, and metal foils of aluminum, copper, stainless steel, steel, phosphorus bronze and the like, are all applicable as covering.

As illustrated in FIG. 4, the coverings 10 may be stripped from the stack or laminate after curing, and recovered by rewinding on the recovery rollers 22. The reuse of recovered coverings may be desirable from the viewpoint of production cost. For this purpose, it is desirable that the covering can be easily separated from the laminate, and therefore an appropriate combination between the covering and the laminate is selected, and, if necessary, a release agent is applied between.

In the present invention, a covering in the form of an endless belt may be reasonably effective, especially in case of using about 1 mm-thick sheet of stainless steel, phosphorus bronze and Teflon. The release agent, if necessary, may preliminarily be applied onto the whole area or both edge zones of the one surface of the covering due to come in contact with the laminate. The application of release agent on the whole area could occasionally cause the agent to migrate to the laminate, resulting in impairment of printability of various types of paste and resist. In such cases, it is desirable that the application of the release agent is confined to the edge zones, and, after curing and stripping the covering, the edge zones of the laminate are removed in order to prevent the product from the above impairment. As release agent, agents of silicone type such as Daifree MS 743 (Daikin Koygo) are preferable.

Among the properties of laminate product, surface smoothness is especially important for printing with resist-paste or resist. The transparency is significant as regards the evaluation of the printed pattern and easy observation of the printed circuit pattern from the reverse side.

As described previously, several impregnated sheet substrates are joined together into a stack with the aid of a pair of rolls or a roller and blade assembly. This aid is reasonable for controlling the content of the liquid resin composition by excluding the excess, and for excluding air bubbles which may be entrapped in the stack on joining. That is the stack is sandwiched between two film or sheet coverings simultaneously with joining (See FIG. 1 at 3), or subsequent to joining (See FIG. 4, at 23) with the aid of a pair of rollers, which exert a certain compression.

The surfaces of the stack prior to being sandwiched are usually uneven macroscopically and microscopically, and the unevenness may be liable to be roughly reproduced on the covering surfaces on sandwiching, especially when flexible coverings are employed, and may be, more or less, imparted to the surfaces of the cured laminate product, according to the non-pressure curing process of the present invention.

Experiments have shown that the smooth surface characteristics required in practice can be secured in the product, when the rigidity of the covering used is more than $3 \times 10^{-3}$ kg·cm, preferably more than $5 \times 10^{-1}$ kg·cm (where the rigidity is expressed as $E \cdot d^3$ Kg·cm, with E for modulus in kg/cm$^2$, and d for thickness in cm).

Figure 2:
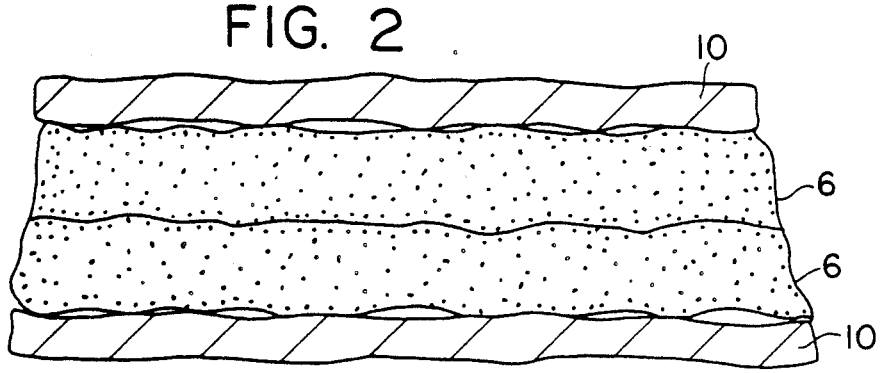
FIG. 2 is a schematic representation of cross-sectional view of a product resulting from the use of covering material of lower modulus.
Figure 3:
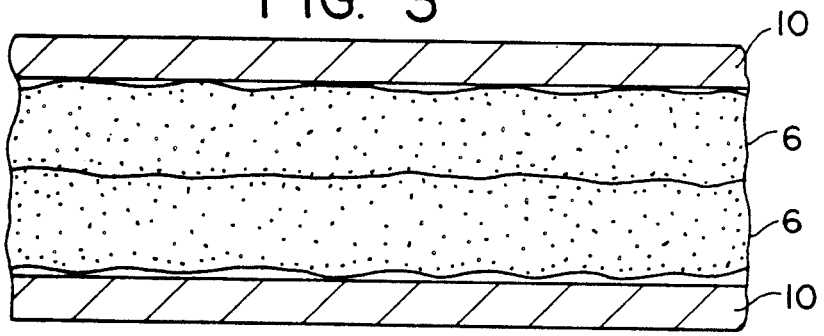
FIG. 3 is a schematic representation of cross-sectional view of products resulting from the use of covering material of higher modulus.

For example, a cotton linter paper and kraft paper of 200 to 300$\mu$ thick and having a basis weight of 150 g/m$^2$ may be used as substrates. Such a paper 6 usually has microscopically uneven surfaces as illustrated in FIG. 2, and consequently produces a covered laminate with roughly reproduced uneven surfaces, if a covering of less than $3 \times 10^{-3}$ kg·cm rigidity, for example, 35 $\mu$ thick polyester film (flexural rigidity: $28.1 \times 10^3$ kg/cm$^2$, rigidity: $1.20 \times 10^{-3}$ kg·cm) is applied. Then the unevenness on the covered laminate is much reduced as illustrated in FIG. 3, is a covering of more than $3 \times 10^{-3}$ kg·cm rigidity, for example, 100$\mu$ thick polyester film (rigidity: $2.81 \times 10^{-2}$ kg·cm) is applied.

Furthermore, the application of a covering of more than $5 \times 10^{-1}$ kg·cm rigidity, for example, 100$\mu$ thick aluminum foil (flexural modulus: $0.67 \times 10^6$ kg/cm$^2$, rigidity: $6.7 \times 10^{-1}$ kg·cm), or 100$\mu$ thick stainless steel foil (flexural rigidity: $1.86 \times 10^6$ kg/cm$^3$, rigidity: 1.86 kg/cm) is much more preferably for carrying out the present invention.

The above film or sheet covering may be either of single ply type or of composite ply type.

As a general rule, the rigidity of a material decreases with a rise in temperature. Because the covering, however, is applied to the surface of the stack usually at room temperature in the present invention, its room-temperature rigidity only need be taken into consideration. Nevertheless, the application of such a plastics film material whose rigidity significantly decreases at the curing temperature of the stack, is not desirable. A film which tends to adhere to cured unsaturated polyester resin or epoxy resin is also not suitable. From this point of view, films made of polyester, polypropylene, Teflon and polyamide-imide, and foils of aluminum, press-rolled copper, and stainless steel are all suitable.

Thus, according to the present invention, the applied covering can be removed from the cured laminate with ease, without the aid of a release agent or release paper. If any intervening material is necessary for removing the covering, it is preferably employed in the form of a composite with the covering.

It is desirable that the covering be so long that it may be continuously unwound from a supply roller 11, applied to and removed from the laminate, and rewound on a recovery roller 22. Otherwise, the use of a covering in the form of an endless belt may of course be effective, and in this case, the covering is preferably flexible to some extent, with a rigidity of $3 \times 10^{-3}$ kg·cm to $3 \times 10^1$ kg·cm.

As is readily understood from FIG. 3, the geometric features of a covered laminate product largely depend upon the roughness or geometric features of the surface of the covering used. This feature is one of the most important properties for laminate products for electrical use. For example, when a composite carbon resistor is made by coating a resist paste on an insulation board, the rougher the surface of the insulation board, the more pinholes and unusual snags are caused, resulting in noise and short useful life of the final product. The desirable surface smoothness of a laminate board may be regarded a $R_{max}$ (maximum surface roughness) less than about 15$\mu$, preferably less than about 9$\mu$.

On the other hand, much lower $R_{max}$ could occasionally cause a reduction in bonding strength between the resist paste and the insulation board, resulting in peeling of the resist layer. This bonding strength may largely depend upon the polarities of the resist paste and insulation board, their mutual compatibility and the surface roughness of the insulation board. More than about 0.4$\mu$ $R_{max}$ for the insulation board gives sufficient bonding strength and non-repellant property.

The surface smoothness was evaluated according to JIS B 0601 "Surface Roughness". It was determined with a stylus tracing tester under the conditions of 2.5$\mu$ radius of curvature of stylus tip and 0.1 g weight of the stylus tip.

The use of a film or sheet covering of surface roughness of 0.4$\mu$ to about 9$\mu$ secures such a laminate product as described above.

The above descriptions have been given as for a paper substrate, whereas they apply to other substrates as well. For example, the textural surface unevenness of a woven glass cloth is not apparently objectionable in carrying out the present invention.

The above description have been given also as for producing electrical laminates with covering on both sides. However, the production of electrical laminates with cladding metal foil on one or both sides also can be achieved in similar ways by means of the present invention.

As a cladding metal foil, the electrolytic copper foil that is on the market for printed circuit board use, is suitable for use because of its corrosion resistance, etching quality, and adhesive quality.

The description of the production of electrical laminates for printed circuit board use, clad on one or both sides with copper foil, electrolytic iron foil or aluminum foil, is given as follows:

According to experiments by the inventors, the metal clad laminates that were prepared using commercial electrolytic copper foil of 1 oz/ft and paper substrates, have occasionally been inferior in surface smoothness to conventional ones prepared by press-molding, but have shown no adverse effects as regards their qualities of screen printing, etching and the like.

For example, practical and useful clad laminates may be produced from unsaturated polyester resin-impregnated substrate stack.

In conventional batchwise press-molding production processes, for example, phenolic resin-impregnated copper-clad paper laminates have been made with the use of electrolytic copper foil that was initially covered with a B-stage adhesive of a phenol-modified butyl rubber type. In the continuous process according to the present invention, however, it has been shown to be much more reasonable from the viewpoint of productivity and product quality if an appropriate adhesive is continuously supplied between the foil and the joined substrate stack. For example, as illustrated in FIG. 6, an adhesive is supplied from a reservoir 27 through a delivery device 28 onto the appropriate side of the foil 10, immediately before covering the stack. Further, it is preferable that the foil coated with the adhesive be subsequently moderately heat-treated by means of a heat oven 26.

In order to secure effectively the bond between the metal foil nd the resin-impregnated substrate, it is desirable to employ an adhesive that does not contain any component such as solvent due to be removed, and generate any useless and adverse byproduct during the curing process but is a liquid or a semiliquid with a preferred viscosity of less than 5,000 poise at room temperature. Such an adhesive may be selected from various types of unsaturated polyester resin, epoxy resin, polyisocyanate resin and various modifications thereof.

These adhesives made is possible to obtain, continuously, metal foil-clad laminates excellent in bonding strength, solder heat resistance, and electrical insulation properties.

Alternatively, the application of adhesive could be carried out by coating the above joined substrate stack prior to covering with the foil, or by injecting simultaneous to covering. These means, however, have been found occasionally to be accompanied by such problems as entrapping of air bubbles, occurrence of unusual curing reaction, and separation of components, resulting in a decrease in production yield or product quality. Against these problems it has been shown to be more effective if, as illustrated in FIG. 6, the foil 10 is applied with the adhesive with the use of a coating device 23, and then heat treated through a heat oven 26. As the coating device 25, a conventional roll coater, blade coater, wire-bar coater or comma coater can be used.

The first purpose of the heat treatment of adhesive-coated foil is to dry the solvent, if the solvent is used. However in the present invention the dried adhesive-coated foil need not be track-free as the conventional process used to require. The second purpose is to pre-cure the thermosetting-type adhesive to a moderate extent, leaving a certain degree of tackiness. The third purpose is to remove air bubbles that may on occasion have been entrapped in the coating, especially when such an adhesive as a two-component epoxy type adhesive of a relatively high viscosity has been employed.

For instance, a description of the production of unsaturated polyester resin-impregnated and copper-clad paper laminate with the use of epoxy resin adhesive is given as follows:

As epoxy resin adhesive, mixed types of bisphenol A-type epoxy resin and polyamide resin are preferable.

The paper 6 is unwound from the storage reel 1, and contacted with the liquid unsaturated polyester resin composition in the impregnating bath 2. Then, several (for example, seven) impregnated papers are joined together into a stack by the laminating device 3, and simultaneously 3 or subsequently 23 covered, on one or both sides, with the electrolytic copper foil 10, which has been coated with epoxy resin adhesive. The foil coated with epoxy resin adhesive is heat-treated preferably at 100° to 150° C. for 2 to 7 minutes, but is allowed to cool to room temperature during the laminating process. Such a heat-treatment is desirable so as to remain a little tacky. Drying to a tack-free state could inhibit adhesion to the stack, while excessive tackiness could allow the adhesive to permeate into the liquid resin component of the stack to a large extent, occasionally resulting in a decrease in the bonding strength. The thickness of the coated adhesive may be 10 to 150 $\mu$m, preferably 20 to 100 $\mu$m.

In compliance with the product requirement, one side of the stack is covered with a plastics film such as a cellophane and polyester film, instead of copper foil.

Then, the covered stack is transferred to the heating device 4, and cured therein. The curing conditions depend upon transferring speed, type of catalyst, etc., but in most cases range 100°–150° C. for 5–60 minutes.

By the above means, the copper-clad laminate, with a foil peel strength of 1.6 to 2.0 kg/cm conforming to XPC to XXXPC grades (NEMA standards), can be produced with excellent productivity. Thus, continuous production of metal-clad laminates is made possible by the present invention.

As liquid thermosetting resin composition suitable for impregnation of the substrate, those which are in the liquid state at room temperature are desirable. However, those which are in the solid state at room temperature may be usable, if they readily turn liquid on heating.

In the present invention, adhesive effects are further improved for example in the following way.

When an unsaturated polyester resin for impregnation of the substrate and an epoxy resin as adhesive are used, the latter is desirably of an amine-curing type, from the viewpoint of concordance with curing rates of both resins. In addition, the selection of the curing catalyst to be added to the unsaturated polyester resin is important. The use of single or combined peroxide catalysts selected from peroxyketals, dialkyl peroxides, and peroxyesters is remarkably superior to the use of those selected from peroxydicarbonates, ketone peroxides, hydroperoxides, and diacylperoxides in order to secure sufficient solder heat-resistance, electrical insultation properties, and bonding strength. The amount added is desirably 0.5 to 2.0 parts per 100 parts of the resin. The reason for the above catalyst selectivity has not been fully understood, but is supposed to relate either to permeation of the catalyst into the adhesive layer of solubilization between the adhesive and the resin liquid, which may possibly take place throughout the contact and curing processes. In fact, the use of such peroxides as peroxydicarbonates, ketone peroxides, hydroperoxides and diacylperoxides occasionally induces unusual curing of the epoxy resin, resulting in inadequate product quality.

Accordingly, as peroxide catalyst suitable for use the present invention, are designated the following compounds: peroxyketals such as 1,1-bis(t-butylperoxy)-3,3,5-trimethylcyclohexane, 1,1-bis(t-butylperoxy)cyclohexane, and n-butyl 4,4-bis(t-butylperoxy)valerate; dialkylperoxides such as di-t-butylperoxide, and 2,5-dimethyl-2,3-di(t-butylperoxy)hexine-3; and peroxyesters such as t-butyl peroxyacetate, t-butyl peroxy-2-ethylhexanote, t-butyl peroxylaurate, and t-butyl peroxybenzoate.

As unsaturated polyester resin, well-known types synthesized from unsaturated dibasic acids, saturated dibasic acids and glycols, are useful, but either bisphenol A-type polyester resins or vinylester-type resins are applicable as well. As cross-linking monomer, styrene is common and also suitable for conducting the present invention.

As epoxy resin for adhesive, those of bisphenol A-type are suitable. As amine-type curing agent, any of the well-known aliphatic or aromatic amines is applicable, but certain polyamide resins, amino-terminated polybutadienenitrile rubbers and their mixtures may be useful as well.

Carrying out the above process with care enables the production of metal foil-clad laminates of excellent qualities with high efficiency. However, with the aim of further minimizing the defects of peeling of clad foil caused by fluctuation of operating conditions, the additional use of certain compounds having both an unsaturated double bond and an epoxy group is especially effective. Certainly, if such compounds as glycidyl methacrylate, glycidal allylether, and partially epoxidized soybean oil are applied intermediately between the adhesive and stack layers when they contact with each other, the affinity between both layers improves much more, and, as a result, the defects of foil peeling can be effectively avoided.

However, if commercially available glass cloth that has already been surface-treated for epoxy resin impregnation is impregnated with epoxy resin liquid, and clad with commercially available electrolytic copper foil for printed circuit use, the above intermediate application may be unnecessary because of sufficient bonding between the epoxy resin and copper foil.

As another means, the application of a surface treating agent, especially a silane coupling agent upon the surface of the copper foil brings out further improved bonding effects, when unsaturated polyester resin- or epoxy resin-impregnated substrates are used. This application is made prior to the possible application of the above adhesive upon the surface of the copper foil.

As a silane coupling agent, any commercial grade for bonding between inorganic and organic materials may be used, although A-1100 and A-187 (Union Carbide) are especially suitable. It is practical to apply continuously and sparingly a 0.1 to 5.0% alcoholic or aqueous solution of the silane coupling agent upon the surface of the copper foil, and to dry it continuously.

In the present invention, it is desirable that the metal foil be passed through a hot-air oven at 100°–200° C for a length of time to remove possible moisture on its surface, even when no surface treating agent is used.

Also the substrate is passed through a hot-air or steam-heating cylinder at 100°–200° C. for a sufficient length of time immediately before impregnation, in order to remove moisture retained therein and to improve its adhesion.

For the purpose of minimizing warping and twisting of the product it has been found that the following means is effective.

In general, cubic contraction of thermosetting resins when cured results in residual strain, and causes warping and twisting of the product. When the curing of the resin is not fully completed, exposure of the product to heating circumstances produces further warping and twisting. The incomplete curing also significantly lowers the thermal resistance, chemical resistance and mechanical properties of the product. Experiments have shown that making curing complete by a single continuous process for laminate production necessitates very large curing equipment and/or a considerable slowdown of line speed.

In the present invention, the stack is cut at a partially cured stage, trimmed off according to the predetermined size, heaped up side by side in multitude, and then treated in another heating chamber to complete curing. Thus, in this continuous process, it is rather desirable that curing of the laminate stack proceed to a certain extent, where the laminate becomes hard enough to be cut by a guillotine cutter and to be separated from the covering with ease. This means makes it possible to yield laminate products with an economical scale of equipment and reasonable line speed of production.

For example, laminates composed of unsaturated polyester resin usually take about 10 hours at 100° C. for complete curing, while they take only about 15 minutes at the same temperature to reach sufficient hardness to be cut.

According to a preferred embodiment of the invention, the laminate is partially cured in a first curing step, cut into suitable size and then subjected to a continued curing step to complete the curing. The first curing step may be continued until the resin becomes essentially tack-free so that the covering sheet may be stripped without sticking. Also the laminate must be self-supporting after the first curing step. Experiments have shown that the stage of curing reaction at which said first curing step is discontinued may be determined in terms of gel content in the semicured resin composition. A gel content of at least 80%, preferably from 90 to 98% based on the weight of resin present in the laminate is suitable.

In general, the widthwise residual strain resulting from curing of the resin component is relatively easy to remove with resulting warp, while the lengthwise one is very difficult to remove because of the long continuation of the laminate. This difference makes residual strain anisotropic, and causes increased warping and twisting of product on exposure to elevated temperature.

In the present invention, the continued curing in the second step after cutting enables warp and residual strain of the product to decrease to a practically tolerable extent, especially in case of one side clad laminated.

The amount of warp of metal foil-clad laminate largely depends upon the type and composition of the impregnating resin used. Generally it is smaller when using epoxy resin, and larger when using unsaturated polyester resin or dialyl phthalate resin. For example, a clad laminate of 1.6 mm thickness, which is made of unsatuated polyester resin-impregnated paper and clad with copper foil of 35 μm thickness, has warp ranging from 0.5 to 30% according to the designation of JIS C-6481.

In the present invention, the above cut laminates are finally and completely cured by exposing to temperatures preferably higher than those of the preceding continuous heat-curing over, or temperatures which would be encountered by the finished laminate upon use, and then the remaining warp is mechanically modified. Thus the finally obtained laminates are practically flat, and of significantly less warp even after exposing to such hot environment.

FIG. 5 contains the illustration of devices used in the above cutting and postcuring processes. A continuous length of laminate partially cured in the heat-curing oven 4 is cut by the cutting device 5. Then cut laminates are transferred into a second heat-curing over 29, subjected to heat treatment at a higher temperature such as 150° C. for such a short time as 15 minutes therein, and finally geometrically modified in two directions which are perpendicular to each other through a warp-modifying device composed of two sets of three roller 31 and a turntable 32. It is preferable that the cut laminates are not restrained by a supporting member in the second curing chamber 29, in other words, the cut laminates are not bound or clamped in the chamber allowing their free movement. The finished product is substantially flat, free of residual strain or internal stress, and resistant to changes in physical and electrical properties upon exposure to elevated temperatures.

Furthermore, in order to attain higher productivity, another means has been found effective wherein the coverings 10 are not only applied on the top and bottom sides of one joined stack, but also inserted among several stacks, which are heat-cured in the oven 4 as one body, and then separated from each other. This needs little change in drying time, impregnating time and curing time, and makes overall productivity improve dramatically. That is to say, the inserted coverings take on the role of separator, and a thick pile formed by multiple and alternate placing of the coverings and joined stacks can be processed as one charge in the same way as described previously.

By this means, both a one-side clad laminate and a two-side clad laminate may be also produced simultaneously from the alternate combination of two stacks and three coverings.

Further, as an example, two unsaturated polyester resin-impregnated paper substrates have inserted between them a predried cellophane film, covered on both sides by copper foils, and, after curing, are separated into two one-side copper-clad laminates, each being 1.6 mm in thickness with a 35 μm thick copper cladding. This secures the double production rate of the same product.

Furthermore, by this means, two or more different thick laminates can be concurrently produced in one batch, by the intermediate use of cellophane coverings as separator. This may contribute to a saving of time losses in product line shifting.

However, when a thick pile of many stacks is subjected to the curing process, care should be taken on various conditions such as heating efficiency, generation of heat by the curing reaction and its removal, and the like. For use in such a case, a heating device which may be controlled section-wise and stepwise according to prevailing conditions may be necessary.

When using unsaturated polyester resin, it is desirable that the amounts of catalyst and curing agent incorporated in the inner layers of the thick pile be reduced in comparison with those in the outer layers, in consideration of the effects of the inner reaction heat. When the sheet is too thick to be cut by a guillotine cutter, the alternative use of a movable slicer may be effective.

Examples carried out under different conditions in accordance with the present invention are described as follows. The properties of the products obtained are summarized in Table 7.

The gel content of semi-cured resin present in the semi-cured laminate may be determined by extracting finely divided particles of the laminate with an affinity solvent and weighing the residue. The gel content may be calculated from the decrease in weight based on the total weight of resin before extraction.

EXAMPLE 1

Apparatus as illustrated in FIG. 4 was used.

An unsaturated polyester resin was synthesized in the usual manner from maleic acid, isophthalic acid, and ethylene glycol in a molar ratio of 82:18:100, and mixed with styrene in an amount of 37% by weight. The viscosity of the resulting liquid resin was about 5 poise at 25° C. Liquid unsaturated polyester resin composition was prepared by adding one part of cumene hydroperoxide and 0.2 parts of 6% cobalt naphthenate solution to 100 parts of the above resin liquid.

The properties of cured samples therefrom are shown in Table 2.

TABLE 2

| | |
|---|---|
| Flexural modulus | 283 Kg/mm$^2$ |
| Rockwell hardness | 106 |
| Glass transition temperature | about 90° C. |

A commercially available kraft paper with the properties shown in Table 3 was used as sheet substrate.

TABLE 3

| | |
|---|---|
| Grade | MKP-150, Tomoegawa |
| Basis weight | about 150 g/m$^2$ |
| Density, air-dried | about 0.53 g/cm$^3$ |
| Mean thickness | about 280 μm |

The polyester film covering 10 were stripped from both sides of the unitary curred member by the use of a pair of rolls 24, and taken up onto rewinding rollers 22.

Main other preparing conditions were as shown in Table 4.

TABLE 4

| Items | Conditions |
|---|---|
| Number of paper substrates (1) | 2 plies |
| Width of paper substrates | 1040 mm |
| Drying oven (12) | no use |
| Impregnating devices (2) | dipping type |
| Impregnating duration for transfering impregnated board from impregnating device (2) to laminating device (3) | 20 minutes |
| Curing duration in heat | 90 minutes |

TABLE 4-continued

| Items | Conditions |
|---|---|
| curing oven (4) | |
| Curing temperature | 80° C. |
| Film coverings (10) | polyester |
| Thickness | 35 μm |
| Width | 1060 mm |
| Rigidity | $1.54 \times 10^{-3}$ kg.cm |
| Flexural modulus | 28100 Kg/cm$^2$ |
| Surface roughness ($R_{max}$) | less than 4μ |
| Cut length | 1020 mm |

The amount of the liquid composition used for the impregnating the paper substrate was adjusted at about 55% based on the total weight of the impregnated paper by adjusting the nip or clearance of rollers which laminate polyester cover sheets 10 on the both sides at 23.

Thus, laminates 7 were continuously obtained with 0.50 mm thickness and 1020×1020 mm peripheral size.

The laminate samples showed no changes either in an alkali-resistance test in a 5% aqueous solution of sodium hydroxide at 40° C. for 30 minutes, or in a solvent-resistance test in boiling toluene for 2 minutes. All samples from other examples described below did so as regard those alkali- and solvent-resisting tests.

EXAMPLE 2

EXAMPLE 1 was repeated except that the paper substrates were continuously passed through a hot-air drying oven 12 at 100° C. for a duration of 10 minutes.

EXAMPLE 3

EXAMPLE 2 was repeated except that the number of paper substrates was increased to 5 plies, and thus laminates 7 of 1.5 mm thickness were obtained. The final resin content in the impregnated substrate was adjusted at about 60%.

EXAMPLE 4

EXAMPLE 3 was repeated except that the unsaturated polyester resin liquid was replaced for a commerically available product RIGOLAC 150 HRN, sold by Showa Kobunshi. Co. The cured sample had a glass transition temperature of 120° C.

EXAMPLE 5

EXAMPLE 3 was repeated except that the unsaturated polyester resin was synthesized from maleic acid, isophthalic acid, and diethylene glycol in a molar ratio of 32:68:100, and added with styrene in an amount of 37% by weight. The viscosity of this resin liquid was 4.5 poise at room temperature. The cured sample had a glass transsition temperature of about 55° C.

EXAMPLES 6, 7 and 8

In these examples, a one-side impregnating technique, in which liquid resin was allowed to flow onto the upper side of the paper substrate by a curtain flow device 2, was used in place of the dipping technique of EXAMPLES 3, 4 and 5. As a result, the number of microscopic bubbles remaining within the product was dramatically reduced, almost to zero, compared with the case of EXAMPLES 1 to 5. In addition, the solder dip resistance of the product was much improved. Other properties of the product were similar to those in EXAMPLES 3, 4 and 5, respectively.

EXAMPLES 9, 10 and 11

EXAMPLES 6, 7 and 8 were repeated except that the resin liquid was initially exposed to a reduced pressure, and that the impregnating time was reduced to 4 minutes.

Using a degassing apparatus as illustrated in FIG. 1, the inner pressure of the airtight cylindrical vessel 9 of 100 cm height and 30 cm inner diameter maintained constant at 20 mmHg, while continuously jetting the resin liquid from the storing vessel 8 to the top of the vessel 9 at a flow rate of 10 liters per minutes. The resin liquid treated under the reduced pressure was continuously pumped out of the bottom of the vessel 9 and up to the impregnating devices 2.

The products obtained in EXAMPLES 9, 10 and 11 had far fewer or no bubbles, and exhibited similar properties, respectively, to those in EXAMLES 3, 4 and 5, regardless of the great reduction in impregnating time.

EXAMPLES 12, 13 and 14

EXAMPLES 3, 4 and 5 were repeated except that t-butylperoxy-2-ethylhexanoate, an aliphatic peroxyester, was used in place of cumene hydroperoxide as curing catalyst.

The laminates obtained were improved in that there was a significant reduction in the odor which was emitted when they are heated at 180° C. for 30 minutes, comparing with those in EXAMPLES 3, 4 and 5 respectively. Further the laminates were cut into a certain length, and treated in a hot-air oven at 100° C. for 10 hours to be fully cured. Then they exhibited high quality as regards solder dip resistance, dimensional stability, electrical insulation properties and the like.

EXAMPLE 15

A liquid unsaturated polyester resin composition was prepared by mixing 100 parts of the unsaturated polyester resin liquid used in EXAMPLE 5, with one part of t-butylperoxy-2-ethylhexanoate used in EXAMPLE 14 and 0.2 parts of 6% cobalt naphthenate solution, then subjected to the degassing treatment as described in EXAMPLES 9, 10 and 11, and finally used for the impregnation. The impregnation took only 5 minutes. The curing temperature was 100° C., and the curing time was shortened to 22.5 minutes by raising the overall transferring speed by three times. Other conditions were the same as in EXAMPLE 1.

Cut laminate samples were found to be of lower quality due to the insufficient curing treatment; therefore they were further treated in a hot-air oven at 100° C. for 10 hours and at 160° C. for 10 minutes to be fully cured. The finally obtained laminates were excellent, especially in solder dip resistance and thermal dimensional stability. Thus, the overall production rate of the apparatus used in EXAMPLE 1 was increased by about three times simply with the additional provision of a second hot-air oven 29 as seen in FIG. 5.

EXAMPLE 16

The paper substrate described in EXAMPLE 1 was preliminarily subjected to pre-impregnating treatment as follows.

Unwound paper was continuously dipped into a bath 14 of 8% methanolic solution of N-methylolacrylamide for 5 minutes, drawn out and air-dried for 30 minutes, and then dried at 100° C. for 20 minutes in a hot-air dryer 12. The resulting pre-impregnated paper had a N-methylolacrylamide pickup of 11.2% by weight.

Five continuous paper substrates were separately pre-impregnated as above, transferred and subsequently processed in the same way as in EXAMPLE 15. The 5 finished laminates were 1.5 mm thick, and exhibited significantly improved electrical insulation properties and solder dip resistance upon humidifying, compared with those in EXAMPLE 15.

EXAMPLE 17

As to polyester film-covered laminates obtained in EXAMPLE 16, a certain gentle undulation was observed on the surface after stripping the polyester film coverings, following the unevenness of the covered substrate layer. In order to prevent this imperfection, EXAMPLE 17 was carried out using long stainless steel foil as covering in place of the polyester film used in EXAMPLE 16. The stainless steel foil was of SUS 304 grade and so-called "BA surface finish", 100 μm in mean thickness, 2.5 μm in $R_{max}$ of surface roughness, and 1.86 Kg·cm in rigidity.

By this means were obtained laminates that were free of the above undulation, superior in surface smoothness or appearance, and satisfactory in printability and ink transistion behavior of various types of resists or paste.

EXAMPLE 18

The paper substrate described in EXAMPLE 1 was pre-impregnated in the following way.

Fifty parts of aqueous solution containing 6 parts of methylolmelamine (Nikaresin S-305, Nippon Carbide Industry) was poured into 50 parts of methanolic solution containing 1.5 parts of oleic acid monoglyceride (Rikemal OL-100, Riken Vitamin Oil) under vigorous agitation to make up a suspension.

A continuous length of said paper was continuously dipped into this suspension, drawn up, heated at 120° C. for 20 minutes, and then processed in the same way as in EXAMPLE 17.

Finally obtained laminates were 1.5 mm thick, and showed properties similar to those in EXAMPLE 17 as seen in Table 7.

EXAMPLE 19

EXAMPLE 18 was repeated except that 1 oz/ft² electrolytic copper foil (T-7, Fukuda Metal Foil & Powder) was used as covering in place of stainless steel foil on only one side, and left unstripped after curing, while the stainless steel foil on the other side was stripped.

The properties of the finished one-side copper clad laminate are given in Table 7.

EXAMPLE 20

The product of EXAMPLE 19 had the drawback of large warp. EXAMPLE 20 was carried out by supplementing a warp-modifying device 31, 32 illustrated in FIG. 5. Adjustment of the clearances between the three rollers enabled the warp to decrease to a large extent.

EXAMPLE 21

EXAMPLE 19 was repeated except that the covering electrolytic copper foil 10 was preliminarily coated with an adhesive using a device 25 as illustrated in FIG. 6.

The composition of the adhesive used in shown in Table 5. The thickness of coating was 60 μm.

As a result, the peel strength of the copper foil and the solder dip resistance of the clad laminate were much improved, exceeding the JIS requirements.

TABLE 5

| Components | Descriptions | Parts |
| --- | --- | --- |
| Epoxy resin | Bisphenol A type<br>Viscosity: 120 to 150 poise at 25° C.<br>Epoxy equivalent: 184 to 194 | 70 |
| Polyamide resin | Polyamide-amine type, dimer acid-based<br>Amine value: 330 to 360<br>Viscosity: 6 to 9 poise at 75° C. | 20 |
| Polybutadiene-nitrile rubber | Amino-terminated polybutadiene-nitrile rubber oligomer<br>Copolymeric ratio of acrylonitrile: 17%<br>Viscosity: 2250 poise at 27° C. | 10 |

EXAMPLE 22

EXAMPLE 21 was repeated except that the electrolytic copper foil 10 was heated at 100° C. for 5 minutes by passing through an oven 26 immediately after coating of the adhesive. Both the solder dip resistance and the foil peel strength of the finished product were further improved.

EXAMPLE 23

EXAMPLE 22 was repeated except that 1,1-bis(t-butylperoxy)3,3,5-trimethylcyclohexane, a peroxyketal compound, was used instead as the curing catalyst.

Consequently, the solder dip resistance upon humidifying (conditions: C-96/55/95) was raised up to 10 to 27 seconds. Other properties of the product were similar to those from EXAMPLE 22.

EXAMPLE 24

EXAMPLE 23 was repeated without any curing accelerator. The properties of the product were similar to those from EXAMPLE 23.

EXAMPLE 25

EXAMPLE 23 was repeated except that the electrolytic copper foil 10 was preliminarily coated with about 10 μm thickness of an 0.5% aqueous solution of silane coupling agent (A-187, Union Carbide) by continuously applying the solution with the use of a coating device (not shown in figures), dried at 100° C. for 2 minutes, and then coated with the adhesive.

The one-side copper-clad laminates obtained were improved, especially as regards solder dip resistance and foil peel strength.

EXAMPLE 26

Eight plies of glass cloth (WE 18K-ZB, Nitto Boseki) were continuously unwound, and moved separately and in parallel. Each ply of the glass cloth was dried at 100° C. for 10 minutes, and continuously coated by a curtain flow technique with a liquid epoxyresin composition, which had been treated under reduced pressure as described in EXAMPLES 9, 10 and 11.

The liquid resin composition used had a viscosity of 6.5 poise at 25° C., and was composed of as shown in Table 6.

TABLE 6

| Components | Parts |
|---|---|
| Epikote 828, Shell Chemicals | 100 |
| Methyl-tetrahydrophthalic anhydride | 80 |
| Benzyldimethylamine | 0.5 |

Each ply of glass cloth was separately and continuously impregnated for 10 minutes, combined into a unitary member and sandwiched between two electrolytic copper foils (T-7, Fukuda Metal Foil and Powder), which had been preliminarily surface-treated with a silane coupling agent (A-1100, Union Carbide). The final resin content in the impregnated glass cloth was adjusted at about 58%. Then the sandwiched member was continuously heat-cured at 130° C. for 60 minutes, cut and further heated at 180° C. for 2 hours.

The laminated products obtained, copper-clad on both sides, were 1.6 mm in thickness, 1020 mm×1020 mm in area and had generally well-balanced properties.

TABLE 7

| Properties | Testing methods | Treating conditions | Ex. 1 | Ex. 2 | Ex. 3 | Ex. 4 | Ex. 5 |
|---|---|---|---|---|---|---|---|
| Solder dip resistance (sec) | JIS C 6481 | C-96/23/65 | 10 | 20 | 22 | 20 | 16 |
|  |  | C-96/55/95 | 1 to 2 | (a) | 2 to 3 | 2 to 3 | 1 to 2 |
| Surface resistivity (ohm) | JIS C 6481 | C-96/23/65 | $3 \times 10^{14}$ | (a) | (b) | $8 \times 10^{13}$ | $6 \times 10^{13}$ |
|  |  | C-96/40/95 | $5 \times 10^{7}$ | (a) | (b) | $2 \times 10^{8}$ | $6 \times 10^{7}$ |
| Dielectric constant | JIS C 6481 (1MHz) | C-96/23/65 | 4.5 | (a) | (b) | 4.2 | 4.6 |
|  |  | C-96/23/65 + D-48/50 | 5.8 | (a) | (b) | 5.5 | 5.9 |
| Dielectric loss tangent | JIS C 6481 (1MHz) | C-96/23/65 | 0.038 | (a) | (b) | 0.030 | 0.039 |
|  |  | C-96/23/65 + D-48/50 | 0.080 | (a) | (b) | 0.075 | 0.088 |
| Punchability | ASTM D-617-44 | C-90/23/65 | very good | (a) | fair | fair | excellent |
| Optimal punching temp. |  | C-90/23/65 | room to 90° C. | (a) | 100° C. | 100° C. | 65° C. |
| Clad peel strength, electrolytic copper foil (Kg/cm) | JIS C 6481 | C-90/23/65 | — | — | — | — | — |
|  |  | C-90/23/65 + C-96/55/95 | — | — | — | — | — |
|  |  | 260° C. × 10 sec., after solder | — | — | — | — | — |
| Odor upon heating |  | 180° C. × 30 min | nasty | (a) | (b) | nasty | nasty |
| Warpage (%) | JIS C 6481 | C-90/23/65 | 0.1 | (a) | (b) | 0.2 | 0.1 |
|  |  | C-90/23/65 + C-76/40/95 | 0.4 | (a) | (b) | 0.3 | 0.3 |
|  |  | 260° C. + 10 sec., after solder | 0.4 | (a) | (b) | 0.6 | 0.3 |
| Existence of bubbles | Visual; microscopic (×100) | A | (d) | (a) | (b) | (a) | (a) |
| Heat expansion rate (%) | Thermo-physical Tester TMS-I (Perkin-Elmer) | after C-90/23/65, 23→150° C., lengthwise | 0.021 | (a) | (b) | — | 0.033 |
|  |  | widthwise | 0.042 | (a) | (b) | — | 0.050 |
|  |  | →, sectional | 2.2 | (a) | (b) | 2.2 | 3.0 |
| Heat contraction rate (%) | The same as above | after C-90/23/65, 23→150→23° C., lengthwise | 0.19 | (a) | (b) | — | 0.22 |
|  |  | widthwise | 0.24 | (a) | (b) | — | 0.35 |
|  |  | →→, sectional | 1.2 | (a) | (b) | 0.47 | 1.4 |
| Surface smoothness | Visual |  | good | (a) | (b) | good | good |
| Printability of resist paste | Visual |  | good | (a) | (b) | good | good |

| Properties | Testing methods | Treating conditions | Ex. 15 | Ex. 16 | Ex. 18 | Ex. 19 |
|---|---|---|---|---|---|---|
| Solder dip resistance (sec) | JIS C 6481 | C-96/23/65 | 18 | 70 | 60 | 35 |
|  |  | C-96/55/95 | 1 to 2 | 18 to 27 | 15 to 25 | 3 to 5 |
| Surface resistivity (ohm) | JIS C 6481 | C-96/23/65 | $7 \times 10^{13}$ | $2 \times 10^{13}$ | $2 \times 10^{12}$ | $2 \times 10^{12}$ |
|  |  | C-96/40/95 | $8 \times 10^{7}$ | $8 \times 10^{8}$ | $2 \times 10^{9}$ | $2 \times 10^{9}$ |
| Dielectric constant | JIS C 6481 (1MHz) | C-96/23/65 | 4.5 | 4.5 | 4.4 | 4.4 |
|  |  | C-96/23/65 + D-48/50 | 5.6 | 4.9 | 4.8 | 4.8 |
| Dielectric loss tangent | JIS C 6481 (1MHz) | C-96/23/65 | 0.036 | 0.033 | 0.032 | 0.032 |
|  |  | C-96/23/65 + D-48/50 | 0.079 | 0.045 | 0.043 | 0.043 |
| Punchability | ASTM D-617-44 | C-90/23/65 | excellent | excellent | very good | very good |
| Optimal punching temp. |  | C-90/23/65 | 65° C. | 60° C. | 65° C. | 65° C. |
| Clad peel strength, electrolytic copper foil (Kg/cm) | JIS C 6481 | C-90/23/65 | — | — | — | 1.2 |
|  |  | C-90/23/65 + C-96/55/95 | — | — | — | 0.8 |
|  |  | 260° C. × 10 sec., after solder | — | — | — | 1.1 |
| Odor upon heating |  | 180° C. × 30 min | trace | trace | trace | trace |
| Warpage (%) | JIS C 6481 | C-90/23/65 | 0.1 | 0.1 | 0.1 | +10 |
|  |  | C-90/23/65 + C-76/40/95 | 0.2 | 0.2 | 0.2 | +2 |
|  |  | 260° C. + 10 sec., after solder | 0.2 | 0.2 | 0.2 | +12 |
| Existence of bubbles | Visual; microscopic (×100) | A | almost nil | almost nil | almost nil | almost nil |
| Heat expansion rate (%) | Thermo-physical Tester TMS-I (Perkin-Elmer) | after C-90/23/65, 23→150° C., lengthwise | 0.040 | 0.041 | 0.051 | 0.051 |
|  |  | widthwise | 0.062 | 0.065 | 0.065 | 0.065 |
|  |  | →, sectional | 3.8 | 3.8 | 3.7 | 3.7 |
| Heat contraction rate (%) | The same as above | after C-90/23/65, 23→150→23° C., lengthwise | 0.12 | 0.098 | 0.093 | 0.093 |
|  |  | widthwise | 0.091 | 0.085 | 0.079 | 0.097 |
|  |  | →→, sectional | 0.9 | 0.9 | 0.8 | 0.8 |
| Surface smoothness | Visual |  | good | good | very good | very good |
| Printability of resist paste | Visual |  | good | good | very good | very good |

| Properties | Testing methods | Treating conditions | Ex. 20 | Ex. 21 | Ex. 22 | Ex. 25 |
|---|---|---|---|---|---|---|
| Solder dip resistance (sec) | JIS C 6481 | C-96/23/65 | (c) | 45 | 60 | 70 |
|  |  | C-96/55/95 | (c) | 5 to 10 | 8 to 18 | 12 to 28 |
| Surface resistivity (ohm) | JIS C 6481 | C-96/23/65 | (c) | $4 \times 10^{12}$ | $4 \times 10^{12}$ | $4 \times 10^{12}$ |
|  |  | C-96/40/95 | (c) | $7 \times 10^{10}$ | $2 \times 10^{11}$ | $2 \times 10^{11}$ |
| Dielectric constant | JIS C 6481 (1MHz) | C-96/23/65 | (c) | 4.3 | 4.3 | 4.3 |
|  |  | C-96/23/65 + D-48/50 | (c) | 4.7 | 4.7 | 4.7 |
| Dielectric loss tangent | JIS C 6481 (1MHz) | C-96/23/65 | (c) | 0.030 | 0.030 | 0.030 |
|  |  | C-96/23/65 + D-48/50 | (c) | 0.041 | 0.041 | 0.041 |

TABLE 7-continued

| Punchability | ASTM D-617-44 | C-90/23/65 | | (c) | very good | very good | very good |
|---|---|---|---|---|---|---|---|
| Optimal punching temp. | | C-90/23/65 | | (c) | 65° C. | 65° C. | 65° C. |
| Clad peel strength, | JIS C 6481 | C-90/23/65 | | (c) | 1.5 | 1.7 | 1.8 |
| electrolytic copper | | C-90/23/65 + C-96/55/95 | | (c) | 1.3 | 1.5 | 1.7 |
| foil (Kg/cm) | | 260° C. × 10 sec., after solder | | (c) | 1.6 | 1.7 | 1.8 |
| Odor upon heating | | 180° C. × 30 min | | (c) | trace | trace | trace |
| Warpage (%) | JIS C 6481 | C-90/23/65 | | +2 | +2 | +2 | +2 |
| | | C-90/23/65 + C-76/40/95 | | −1 | −1 | −1 | −1 |
| | | 260° C. + 10 sec., after solder | | +3 | +3 | +3 | +3 |
| Existence of bubbles | Visual; microscopic (×100) | A | | (c) | (e) | almost nil | almost nil |
| Heat expansion rate (%) | Thermo-physical Tester TMS-I (Perkin-Elmer) | after C-90/23/65, 23 →150° C., →, | lengthwise widthwise sectional | (c) (c) (c) | 0.051 0.065 3.7 | 0.051 0.065 3.7 | 0.051 0.065 3.7 |
| Heat contraction rate (%) | The same as above | after C-90/23/65, 23 →150 →23° C., → →, | lengthwise widthwise sectional | (c) (c) (c) | 0.093 0.097 0.8 | 0.093 0.097 0.8 | 0.090 0.079 0.7 |
| Surface smoothness | Visual | | | (c) | very good | very good | very good |
| Printability of resist paste | Visual | | | (c) | very good | very good | very good |

| | Properties | Testing methods | Treating conditions | | Ex. 26 |
|---|---|---|---|---|---|
| | Solder dip resistance (sec) | JIS C 6481 | C-96/23/65 C-96/55/95 | | >120 — |
| | Surface resistivity (ohm) | JIS C 6481 | C-96/23/65 C-96/40/95 | | $2 \times 10^{13}$ $4 \times 10^{12}$ |
| | Dielectric constant | JIS C 6481 (1MHz) | C-96/23/65 C-96/23/65 + D-48/50 | | 4.6 4.9 |
| | Dielectric loss tangent | JIS C 6481 (1MHz) | C-96/23/65 C-96/23/65 + D-48/50 | | 0.021 0.025 |
| | Punchability Optimal punching temp. | ASTM D-617-44 | C-90/23/65 C-90/23/65 | | — — |
| | Clad peel strength, electrolytic copper foil (Kg/cm) | JIS C 6481 | C-90/23/65 C-90/23/65 + C-96/55/95 260° C. × 10 sec., after solder | | 1.9 1.7 1.8 |
| | Odor upon heating | | 180° C. × 30 min | | — |
| | Warpage (%) | JIS C 6481 | C-90/23/65 C-90/23/65 + C-76/40/95 260° C. + 10 sec., after solder | | 0 0 0 |
| | Existence of bubbles | Visual; microscopic (×100) | A | | almost nil |
| | Heat expansion rate (%) | Thermo-physical Tester TMS-I (Perkin-Elmer) | after C-90/23/65, 23 →150° C., →, | lengthwise widthwise sectional | 0.113 0.119 0.71 |
| | Heat contraction rate (%) | The same as above | after C-90/23/65, 23 →150 →23° C., → →, | lengthwise widthwise sectional | 0.031 0.040 0.83 |
| | Surface smoothness | Visual | | | very good |
| | Printability of resist paste | Visual | | | very good |

(Notes)
(a): Similar to Ex. 1. (b): Similar to Ex. 2. (c): Similar to Ex. 19. (d): A few microscopic bubbles. (e): A few in adhesive layer only.

The above has been offered for illustrating purposes only, and it is not for the purpose of limiting the scope of this invention, which is defined in the claims below.

We claim:

1. In a continuous process for producing a metal clad reinforced resin laminate comprising the steps of (a) impregnating a fibrous cellulosic substrate with a liquid unsaturated polyester resin which is free of volatile solvent and is capable of curing without generating liquid and gaseous by-products; (b) laminating a plurality of the resin-impregnated substrates into a unitary member; (c) sandwiching the laminate between a pair of covering sheets, at least one of which is a cladding metal foil capable of permanently bonding to the resin-impregnated substrates after the laminate is cured; and (d) curing the laminate while supporting it between the pair of covering sheets without applying any appreciable pressure thereto; the improvement comprising:
(e) impregnating the substrate in step (a) to a final resin content of 10-90% by weight, based on the total weight of the resin-impregnated substrate;
(f) partially curing the sandwiched laminate in step (d) at an elevated temperature until the metal foil is firmly bonded in position and the entire structure is sufficiently hard and self-supporting to be cut into lengths with a guillotine cutter or movable slicer;
(g) cutting a continuous length of the partially cured laminate into a predetermined length;
(h) fully curing the cut length of said laminate at an elevated temperature to decrease warp and residual strain in the laminate; and
(i) mechanically correcting any distortion in the configuration of the fully cured laminate by geometrically modifying the warp in two directions which are perpendicular to each other to form a finished product which is substantially flat, free of residual strain or internal stress, and resistant to changes in physical and electrical properties upon exposure to elevated temperatures.

2. The process of claim 1, wherein the other covering sheet is nonadherent to said resin impregnated substrate after the laminate is cured, including the step of stripping said other covering sheet after step (b).

3. The process of claim 1, wherein the elevated temperature in the second curing stage is higher than the temperature in the first curing stage.

4. The process of claim 3, wherein curing in the second curing stage is carried out without restraining the cut lengths of the laminate by a supporting member.

5. The process of claim 1, wherein the first curing stage is discontinued when the gel content in the partially cured resin is at least 80%, based on the weight of total resin present in said unitary member.

6. The process of claim 5, wherein the gel content is from 90% to 98% by weight.

* * * * *

UNITED STATES PATENT AND TRADEMARK OFFICE
CERTIFICATE OF CORRECTION

PATENT NO. : 4,994,133

DATED : February 19, 1991

INVENTOR(S) : Oizumi et al

It is certified that error appears in the above-identified patent and that said Letters Patent is hereby corrected as shown below:

Title Page, Inventors:

Second Inventors name:

Reads: "Masakazu Uekira,"

Should Read: --Masakazu Uekita,--

Signed and Sealed this

Twenty-fifth Day of August, 1992

*Attest:*

DOUGLAS B. COMER

*Attesting Officer*      *Acting Commissioner of Patents and Trademarks*